US011705443B2

(12) United States Patent
Maejima et al.

(10) Patent No.: US 11,705,443 B2
(45) Date of Patent: Jul. 18, 2023

(54) SEMICONDUCTOR MEMORY DEVICE

(71) Applicant: Kioxia Corporation, Tokyo (JP)

(72) Inventors: Hiroshi Maejima, Tokyo (JP);
Katsuaki Isobe, Yokohama Kanagawa (JP); Nobuaki Okada, Yokohama Kanagawa (JP); Hiroshi Nakamura, Fujisawa Kanagawa (JP); Takahiro Tsurudo, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 203 days.

(21) Appl. No.: 17/012,111

(22) Filed: Sep. 4, 2020

(65) Prior Publication Data
US 2021/0118862 A1 Apr. 22, 2021

(30) Foreign Application Priority Data
Oct. 16, 2019 (JP) .................. 2019-189464

(51) Int. Cl.
*H01L 25/18* (2023.01)
*G11C 16/04* (2006.01)
(Continued)

(52) U.S. Cl.
CPC .......... *H01L 25/18* (2013.01); *G11C 16/0483* (2013.01); *G11C 16/08* (2013.01);
(Continued)

(58) Field of Classification Search
CPC ..... H01L 25/18; H01L 24/08; H01L 25/0657; H01L 2224/08145; H01L 2924/1431; H01L 2924/14511; G11C 16/08; G11C 16/26

See application file for complete search history.

(56) References Cited

U.S. PATENT DOCUMENTS 8,144,500 B2   3/2012   Kono
8,493,800 B2   7/2013   Terada et al.
(Continued)

FOREIGN PATENT DOCUMENTS

JP   2009223971 A   10/2009
JP   5300709 B2      9/2013
WO   WO2019132939 A1 * 7/2019   ........... H01L 27/108

OTHER PUBLICATIONS

U.S. Appl. No. 16/795,763; First Named Inventor: Naohito Morozumi; Title: "Semiconductor Memory Device"; filed Feb. 20, 2020.
(Continued)

*Primary Examiner* — Jasmine J Clark
(74) *Attorney, Agent, or Firm* — Holtz, Holtz & Volek PC

(57) ABSTRACT

A semiconductor memory device according to an embodiment includes a substrate, a first memory cell, a first bit line, a first word line, a first transistor, and a second transistor. The first memory cell is provided above the substrate. The first bit line extends in a first direction. The first bit line is coupled to the first memory cell. The first word line extends in a second direction intersecting the first direction. The first word line is coupled to the first memory cell. The first transistor is provided on the substrate. The first transistor is coupled to the first bit line. The second transistor is provided below the first memory cell and on the substrate. The second transistor is coupled to the first word line.

20 Claims, 22 Drawing Sheets

(51) Int. Cl.
  *G11C 16/08*   (2006.01)
  *G11C 16/26*   (2006.01)
  *H01L 23/00*   (2006.01)
  *H01L 25/065*  (2023.01)

(52) U.S. Cl.
  CPC .............. *G11C 16/26* (2013.01); *H01L 24/08* (2013.01); *H01L 25/0657* (2013.01); *H01L 2224/08145* (2013.01); *H01L 2924/1431* (2013.01); *H01L 2924/14511* (2013.01)

(56) References Cited

U.S. PATENT DOCUMENTS

| | | |
|---|---|---|
| 9,941,015 B2 | 4/2018 | Abe et al. |
| 2009/0230435 A1 | 9/2009 | Maejima |
| 2011/0317463 A1 | 12/2011 | Maejima |
| 2012/0163060 A1 | 6/2012 | Maejima |
| 2014/0085979 A1 | 3/2014 | Kono |

OTHER PUBLICATIONS

U.S. Appl. No. 17/016,580; First Named Inventor: Hiroshi Maejima; Title: "Semiconductor Memory Device"; filed Sep. 10, 2020.

\* cited by examiner

SEMICONDUCTOR MEMORY DEVICE

CROSS-REFERENCE TO RELATED APPLICATIONS

This application is based upon and claims the benefit of priority from Japanese Patent Application No. 2019-189464, filed Oct. 16, 2019, the entire contents of which are incorporated herein by reference.

FIELD

Embodiments described herein relate generally to a semiconductor memory device.

BACKGROUND

There is known a NAND flash memory capable of storing data in a nonvolatile manner.

DETAILED DESCRIPTION

In general, according to one embodiment, a semiconductor memory device includes a substrate, a first memory cell, a first bit line, a first word line, a first transistor, and a second transistor. The first memory cell is provided above the substrate. The first bit line extends in a first direction. The first bit line is coupled to the first memory cell. The first word line extends in a second direction intersecting the first direction. The first word line is coupled to the first memory cell. The first transistor is provided on the substrate. The first transistor is coupled to the first bit line. The second transistor is provided below the first memory cell and on the substrate. The second transistor is coupled to the first word line.

Hereinafter, embodiments will be described with reference to the accompanying drawings. Each embodiment illustrates an apparatus and a method for embodying the technical idea of the invention. The drawings are schematic or conceptual, and the dimensions and scales of the drawings are not necessarily the same as those of actual products. The technical concept underlying the present invention is not limited by the shapes, structure, arrangements, etc. of the components.

In the description below, elements having substantially the same functions and configurations will be denoted by the same reference symbols. The numbers after the letters of reference symbols are referred to by the reference symbols containing the same letters and are used to distinguish between elements having similar configurations. Where elements denoted by reference symbols including the same symbols need not be discriminated from each other, they will be denoted by reference symbols including only letters.

[1] First Embodiment

A semiconductor memory device 1 according to the first embodiment is, for example, a NAND flash memory. The semiconductor memory device 1 according to the first embodiment will be described.

[1-1] Overall Configuration of Semiconductor Memory Device 1

Figure 1:
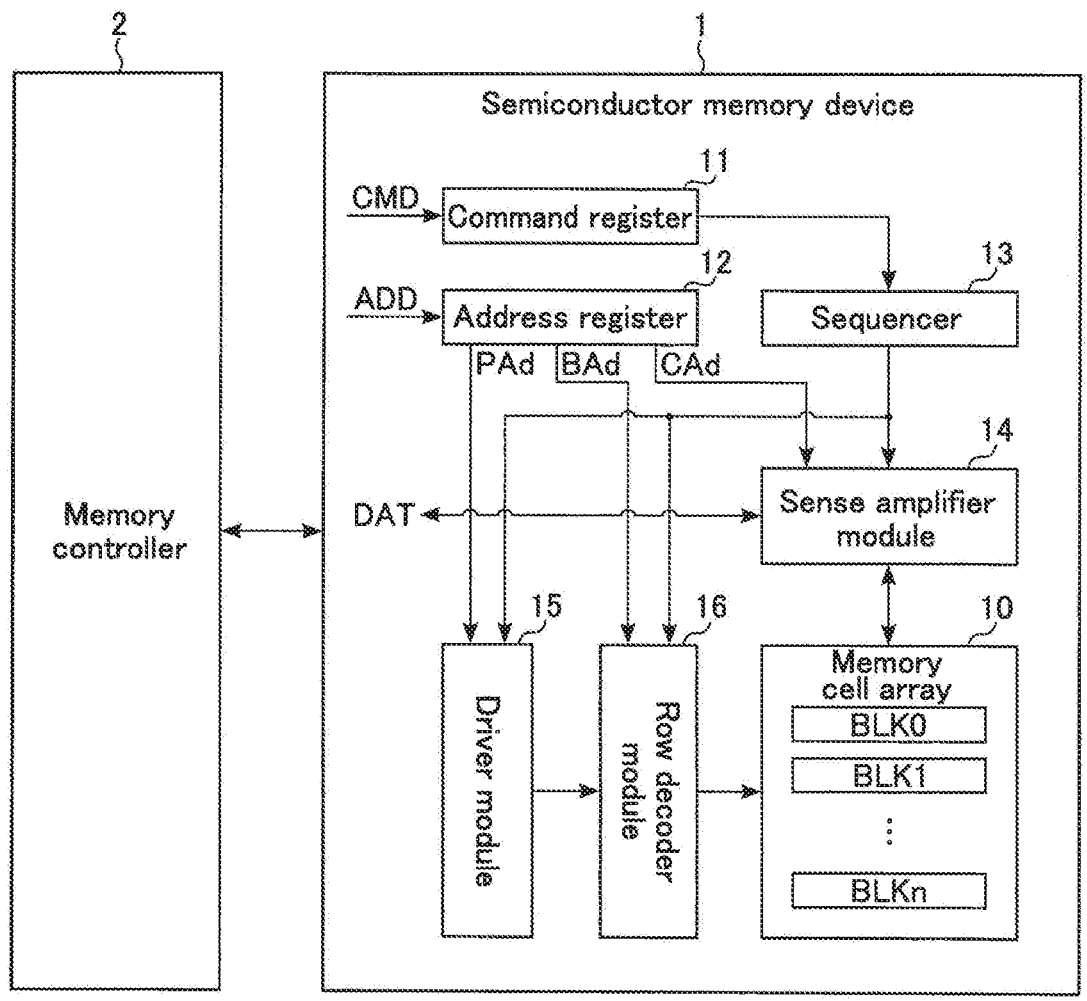
FIG. 1 is a block diagram illustrating a semiconductor memory device according to a first embodiment.

FIG. 1 is a block diagram illustrating a configuration example of the semiconductor memory device 1 according to the first embodiment. As shown in FIG. 1, the semiconductor memory device 1 can be controlled by an external memory controller 2. The semiconductor memory device 1 includes, for example, a memory cell array 10, a command register 11, an address register 12, a sequencer 13, a sense amplifier module 14, a driver module 15 and a row decoder module 16.

The memory cell array 10 includes a plurality of blocks BLK0 to BLKn (n is an integer of 1 or more). The block BLK is a set of memory cells capable of storing data in a nonvolatile manner, and is used, for example, as a data erase unit. The memory cell array 10 is provided with a plurality of bit lines and a plurality of word lines. For example, each memory cell is associated with one bit line and one word line.

The command register 11 holds a command CMD which the semiconductor memory device 1 receives from the memory controller 2. The command CMD includes, for example, an instruction to cause the sequencer 13 to execute a read operation, a write operation, an erase operation, etc.

The address register 12 holds address information ADD which the semiconductor memory device 1 receives from the memory controller 2. The address information ADD includes, for example, a block address BAd, a page address PAd and a column address CAd. For example, the block address BAd, the page address PAd and the column address CAd are used to select a block BLK, a word line and a bit line, respectively.

The sequencer 13 controls the overall operation of the semiconductor memory device 1. For example, the sequencer 13 controls the sense amplifier module 14, driver module 15, row decoder module 16 etc., based on the command CMD held in the command register 11, to execute a read operation, a write operation, an erase operation, etc.

The sense amplifier module 14 applies a desired voltage to each bit line in accordance with write data DAT received from the memory controller 2 in the write operation. Further, in the read operation, the sense amplifier module 14 determines data stored in the memory cell, based on the voltage of the bit line, and transfers the determination result to the memory controller 2 as read data DAT.

The driver module 15 generates voltages used in the read operation, write operation, erase operation, etc. Also, the driver module 15 applies the generated voltages to the signal line corresponding to the selected word line, based on, for example, the page address PAd held in the address register 12.

The row decoder module 16 selects one of blocks BLK in the corresponding memory cell array 10, based on the block address BAd held in the address register 12. Also, the row decoder module 16 transfers, for example, the voltage applied to the signal line corresponding to the selected word line to the selected word line in the selected block BLK.

The semiconductor memory device 1 and memory controller 2 described above may constitute one semiconductor device by combining them together. Examples of such a semiconductor device include a memory card such as an SD™ card, and a solid state drive (SSD).

[1-2] Circuit Configuration of Semiconductor Memory Device 1

[1-2-1] Circuit Configuration of Memory Cell Array 10

Figure 2:
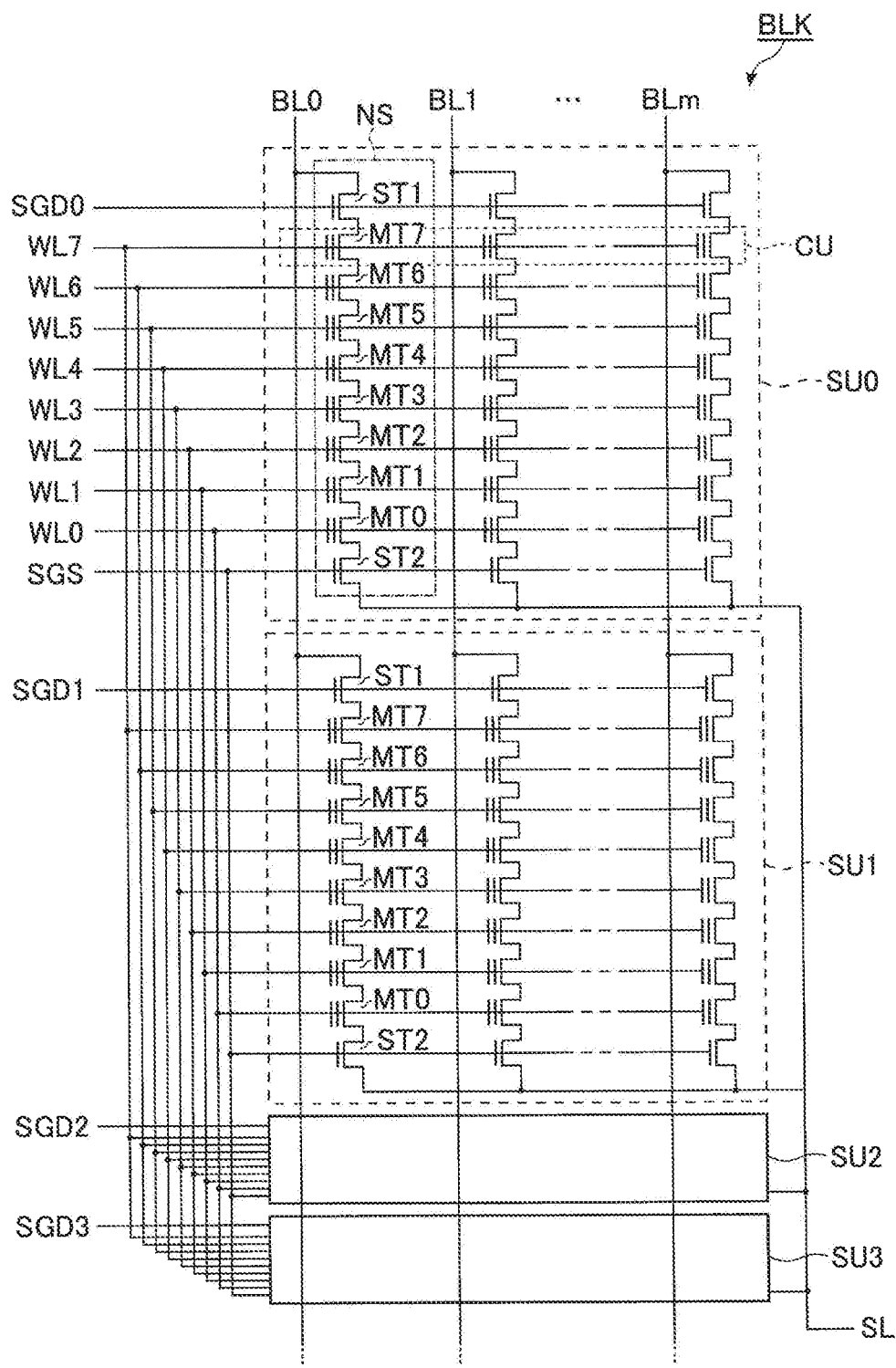
FIG. 2 is a circuit diagram of a memory cell array provided in the semiconductor memory device according to the first embodiment.

FIG. 2 illustrates an example of the circuit configuration of the memory cell array 10 provided in the semiconductor memory device 1 of the first embodiment, and shows one block BLK extracted out of the plurality of blocks BLK included in the memory cell array 10. As shown in FIG. 2, the block BLK includes, for example, four string units SU0 to SU3.

Each string unit SU includes a plurality of NAND strings NS respectively associated with bit lines BL0 to BLm (m is an integer of 1 or more). Each NAND string NS includes, for example, memory cell transistors MT0 to MT7 and select transistors ST1 and ST2. Each of the memory cell transistors MT includes a control gate and a charge storage layer, and holds data in a nonvolatile manner. Select transistors ST1 and ST2 are used for selecting string unit SU during various operations.

In each NAND string NS, memory cell transistors MT0 to MT7 are coupled in series. The drain of select transistor ST1 is coupled to the associated bit line BL. The source of select transistor ST1 is coupled to one end of serially-coupled memory cell transistors MT0 to MT7. The drain of select transistor ST2 is coupled to the other end of the serially-coupled memory cell transistors MT0 to MT7. The source of select transistor ST2 is coupled to source line SL.

In the same block BLK, the control gates of memory cell transistors MT0 to MT7 are commonly coupled to word lines WL0 to WL7, respectively. The gates of select transistors ST1 in string units SU0 to SU3 are commonly coupled to select gate lines SGD0 to SGD3, respectively. The gates of select transistors ST2 included in the same block BLK are commonly coupled to select gate line SGS.

Different column addresses are assigned to the bit lines BL0 to BLm. Each bit line BL is shared by NAND strings NS to which the same column address is assigned in each block BLK. Each of word lines WL0 to WL7 is provided for each block BLK. Source line SL is shared by a plurality of blocks BLK.

A set of memory cell transistors MT coupled to a common word line WL in one string unit SU are referred to, for example, as a cell unit CU. For example, the storage capacity of the cell unit CU including memory cell transistors MT each storing 1-bit data is defined as "1 page data". The cell unit CU may have a storage capacity of two page data or more, in accordance with the number of bits of data stored in the memory cell transistor MT.

The circuit configuration of the memory cell array 10 provided in the semiconductor memory device 1 of the first embodiment is not limited to the circuit configuration described above. For example, the number of string units SU included in each block BLK and the number of memory cell transistors MT and select transistors ST1 and ST2 included in each NAND string NS can be designed to be optional numbers.

[1-2-2] Circuit Configuration of Sense Amplifier Module 14

Figure 3:
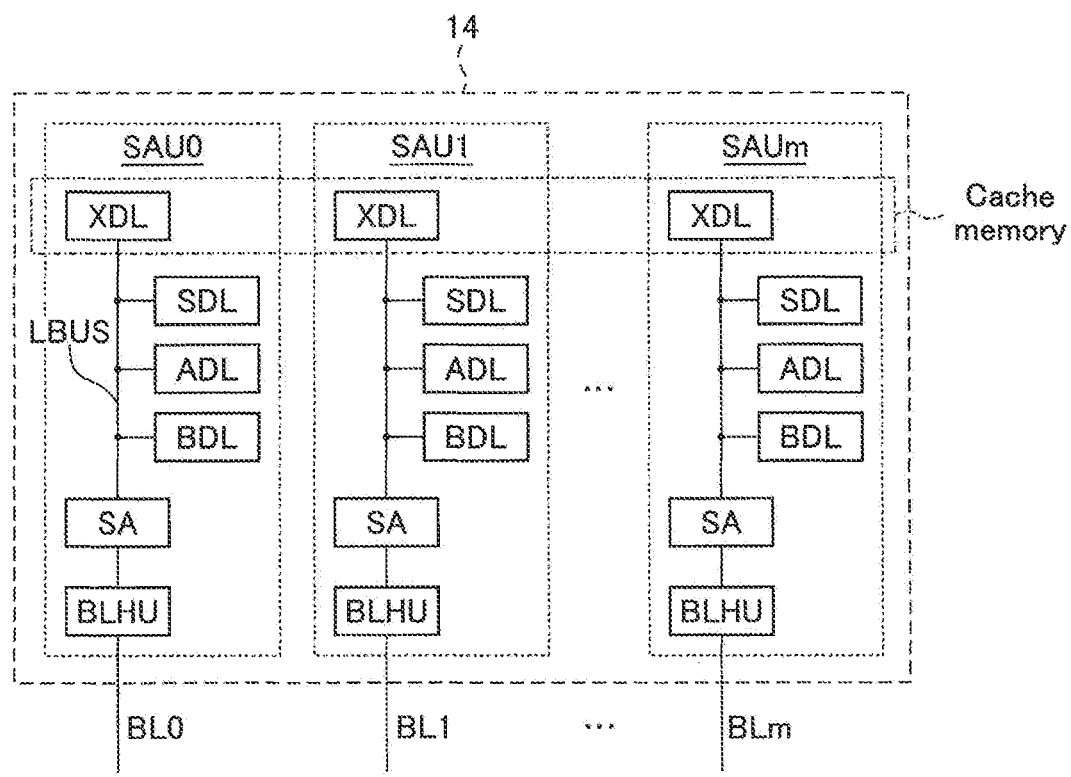
FIG. 3 is a circuit diagram illustrating an example of a circuit configuration of a sense amplifier module provided in the semiconductor memory device according to the first embodiment.

FIG. 3 illustrates an example of a circuit configuration of the sense amplifier module 14 included in the semiconductor memory device according to the first embodiment. As shown in FIG. 3, the sense amplifier module 14 includes a plurality of sense amplifier units SAU0 to SAUm. Sense amplifier units SAU0 to SAUm are associated respectively with bit lines BL0 to BLm. Each sense amplifier unit SAU includes, for example, a bit line hookup unit BLHU, a sense amplifier SA, a bus LBUS, and latch circuits SDL, ADL, BDL and XDL.

In each sense amplifier unit SAU, the bit line coupling unit BLHU is coupled between the associated bit line BL and the sense amplifier SA. For example, in a read operation, the sense amplifier SA determines whether the read data is "0" or "1" based on a voltage of the associated bit line BL. In other words, the sense amplifier SA senses data read to the associated bit line BL, and determines the data stored by the selected memory cell. Latch circuits SDL, ADL, BDL, and XDL temporarily hold read data, write data, etc.

Each of the sense amplifier SA and the latch circuits SDL, ADL, BDL and XDL is coupled to the bus LBUS, so that data can be transmitted and received therebetween via the bus LBUS. Latch circuit XDL is coupled to an input/output circuit (not shown) of the semiconductor memory device 1, and is used to input and output data between the sense amplifier unit SAU and the input/output circuit. Latch circuit XDL can also be used as, for example, a cache memory of the semiconductor memory device 1. For example, even when latch circuits SDL, ADL, and BDL are in use, the semiconductor memory device 1 can be in a ready state if latch XDL is available.

Figure 4:
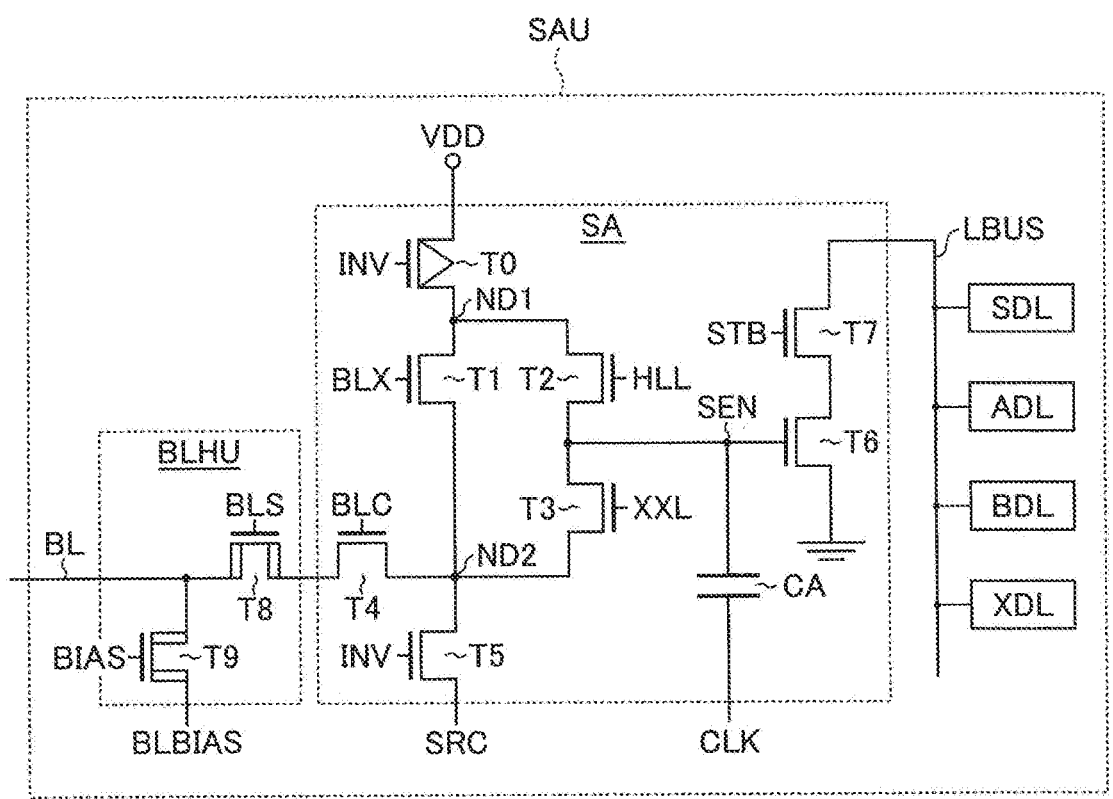
FIG. 4 illustrates an example of a circuit configuration of a sense amplifier unit included in the semiconductor memory device according to the first embodiment.

FIG. 4 illustrates an example of a circuit configuration of the sense amplifier unit SAU included in the semiconductor memory device 1 according to the first embodiment. As shown in FIG. 4, the sense amplifier SA includes, for example, transistors T0 to T7 and a capacitor CA, and the bit line hookup unit BLHU includes transistors T8 and T9.

Transistor T0 is a p-type MOS transistor. Each of transistors T1 to T7 is an n-type MOS transistor. Each of transistors T8 and T9 is an n-type MOS transistor that has a higher breakdown voltage than each of transistors T0 to T7. In the description below, transistors T0 to T7 will be referred to as low-breakdown-voltage transistors, and transistors T8 and T9 will be referred to as high-breakdown-voltage transistors.

The source of transistor T0 is coupled to a power supply line. The drain of transistor T0 is coupled to node ND1. The gate of transistor T0 is coupled to node INV. The drain of transistor T1 is coupled to node ND1. The source of transistor T1 is coupled to node ND2. Control signal BLX is input to the gate of transistor T1. The drain of transistor T2 is coupled to node ND1. The source of transistor T2 is coupled to node SEN. Control signal HLL is input to the gate of transistor T2.

The drain of transistor T3 is coupled to node SEN. The source of transistor T3 is coupled to node ND2. Control signal XXL is input to the gate of transistor T3. The drain of transistor T4 is coupled to node ND2. Control signal BLC is input to the gate of transistor T4. The drain of transistor T5 is coupled to node ND2. The source of transistor T5 is coupled to node SRC. The gate of transistor T5 is coupled to, for example, node INV of latch circuit SDL.

The source of transistor T6 is grounded. The gate of transistor T6 is coupled to node SEN. The drain of transistor T7 is coupled to the bus LBUS. The source of transistor T7 is coupled to the drain of transistor T6. Control signal STB is input to the gate of transistor T7. One electrode of capacitor CA is coupled to node SEN. The other electrode of capacitor CA is supplied with clock CLK.

The drain of transistor T8 is coupled to the source of transistor T4. The source of transistor T8 is coupled to bit line BL. Control signal BLS is input to the gate of transistor T8. The drain of transistor T9 is coupled to node BLBIAS. The source of transistor T9 is coupled to bit line BL. Control signal BIAS is input to the gate of transistor T9.

In the circuit configuration of the sense amplifier unit SAU described above, for example, power supply voltage VDD is applied to the power supply line coupled to the source of transistor T0. For example, ground voltage VSS is applied to node SRC. For example, erase voltage VERA is applied to node BLBIAS. Node INV is a node included in latch circuit SDL, and the voltage of node INV changes based on the data held by the latch circuit SDL. Each of control signals BLX, HLL, XXL, BLC, STB, BLS and BIAS and clock CLK are generated by the sequencer 13, for example. In a read operation, the sense amplifier SA determines the data read to the bit line BL, for example, based on the timing at which control signal STB is asserted.

It should be noted that the sense amplifier module 14 included in the semiconductor memory device 1 according to the first embodiment is not limited to the circuit configuration described above. For example, the number of latch circuits included in each sense amplifier unit SAU can be changed as appropriate, based on the number of pages stored in one cell unit CU. The sense amplifier SA may have another circuit configuration as long as it can determine the data read to the bit line BL. Transistor T9 may be omitted in the bit line hookup unit BLHU.

[1-2-3] Circuit Configuration of Row Decoder Module 16

Figure 5:
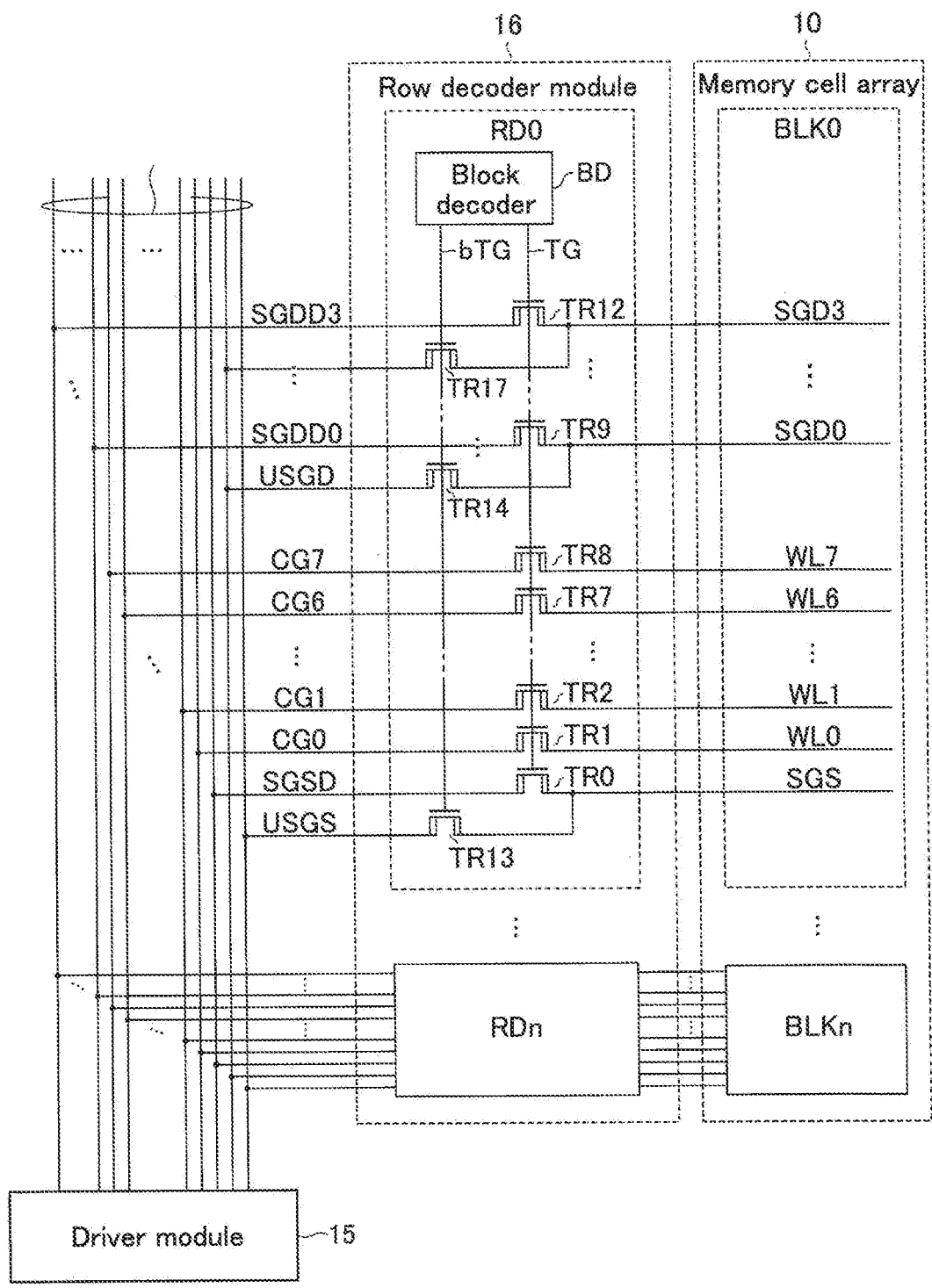
FIG. 5 is a circuit diagram illustrating an example of a circuit configuration of a row decoder module included in the semiconductor memory device according to the first embodiment.

FIG. 5 illustrates an example of a circuit configuration of the row decoder module 16 included in the semiconductor memory device 1 according to the first embodiment. As shown in FIG. 5, the row decoder module 16 includes a plurality of row decoders RD0 to RDn. Row decoders RD0 to RDn are associated with the blocks BLK0 to BLKn, respectively. FIG. 5 shows a detailed circuit configuration of row decoder RD0. The other row decoders RD have a similar circuit configuration to that of row decoder RD0. The row decoder RD includes, for example, a block decoder BD, transfer gate lines TG and bTG, and transistors TR0 to TR17.

The block decoder BD decodes block address BAd. The block decoder BD applies predetermined voltages to transfer gate lines TG and bTG based on the decoding result. Specifically, the block decoder BD applies to transfer gate line bTG, an inverted signal of the signal applied to transfer gate line TG. The voltage applied to transfer gate line TG and the voltage applied to transfer gate line bTG have a complementary relationship.

Each of transistors TR0 to TR17 is a high-breakdown-voltage n-type MOS transistor. The gates of transistors TR0 to TR12 are commonly coupled to transfer gate line TG. The gates of transistors TR13 to TR17 are commonly coupled to transfer gate line bTG. That is, each transistor TR is controlled by the block decoder BD. Further, each transistor TR is coupled to the driver module 15 via a signal line shared by the blocks BLK.

The drain of transistor TR0 is coupled to signal line SGSD. Signal line SGSD is shared by a plurality of blocks BLK and is used as a global transfer gate line corresponding to the selected block BLK. The source of transistor TR0 is coupled to select gate line SGS. Select gate line SGS is used as a local transfer gate line provided for each block.

The drains of transistors TR1 to TR8 are coupled to signal lines CG0 to CG7, respectively. Each of signal lines CG0 to CG7 is used as a global word line shared by a plurality of blocks BLK. The sources of transistors TR1 to TR8 are coupled to word lines WL0 to WL7, respectively. Each of word lines WL0 to WL7 is used as a local word line provided for each block.

The drains of transistors TR9 to TR12 are coupled to signal lines SGDD0 to SGDD3, respectively. Each of signal lines SGDD0 to SGDD3 is shared by a plurality of blocks BLK and is used as a global transfer gate line corresponding to the selected block BLK. The sources of transistors TR9 to TR12 are coupled to select gate lines SGD0 to SGD3, respectively. Each of select gate lines SGD0 to SGD3 is used as a local transfer gate line provided for each block.

The drain of transistor TR13 is coupled to signal line USGS. The source of transistor TR13 is coupled to select gate line SGS. The drains of transistors TR14 to TR17 are commonly coupled to signal line USGD. The sources of transistors TR14 to TR17 are coupled to select gate lines SGD0 to SGD3, respectively. Each of signal lines USGS and USGD is shared by a plurality of blocks BLK and is used as a global transfer gate line corresponding to the selected block BLK.

With the above configuration, the row decoder module 16 can select block BLK. Briefly speaking, in various operations, the block decoder BD corresponding to selected block BLK applies "H" level and "L" level voltages to transfer gate lines TG and bTG, respectively, and the block decoder BD corresponding to non-selected block BLK applies "L" level and "H" level voltages to transfer gate lines TG and bTG, respectively.

It should be noted that the row decoder module 16 included in the semiconductor memory device 1 according to the first embodiment is not limited to the circuit configuration described above. For example, the number of transistors TR included in the row decoder module 16 can be changed as appropriate based on the number of memory cell transistors and select transistors provided in each block BLK. In the present specification, the transistor TR included in the row decoder RD is also referred to as a transfer switch WLSW.

[1-3] Structure of Semiconductor Memory Device 1

In the description below, a configuration of the semiconductor memory device 1 according to the first embodiment will be mentioned. In the drawings referred to below, an X direction corresponds to the extending direction of the word lines WL, a Y direction corresponds to the extending direction of the bit lines BL, and a Z direction corresponds to a direction vertical to the surface of a semiconductor substrate used for forming the semiconductor memory device 1. In the plan views, hatching is added where appropriate to make the views easy to see. The hatching added to the plan views is not necessarily related to the materials or characteristics of the hatched components. In the plan views and sectional views, wirings, contacts, interlayer insulating films are omitted as appropriate to make the views easy to see.

[1-3-1] Overall Structure of Semiconductor Memory Device

Figure 6:
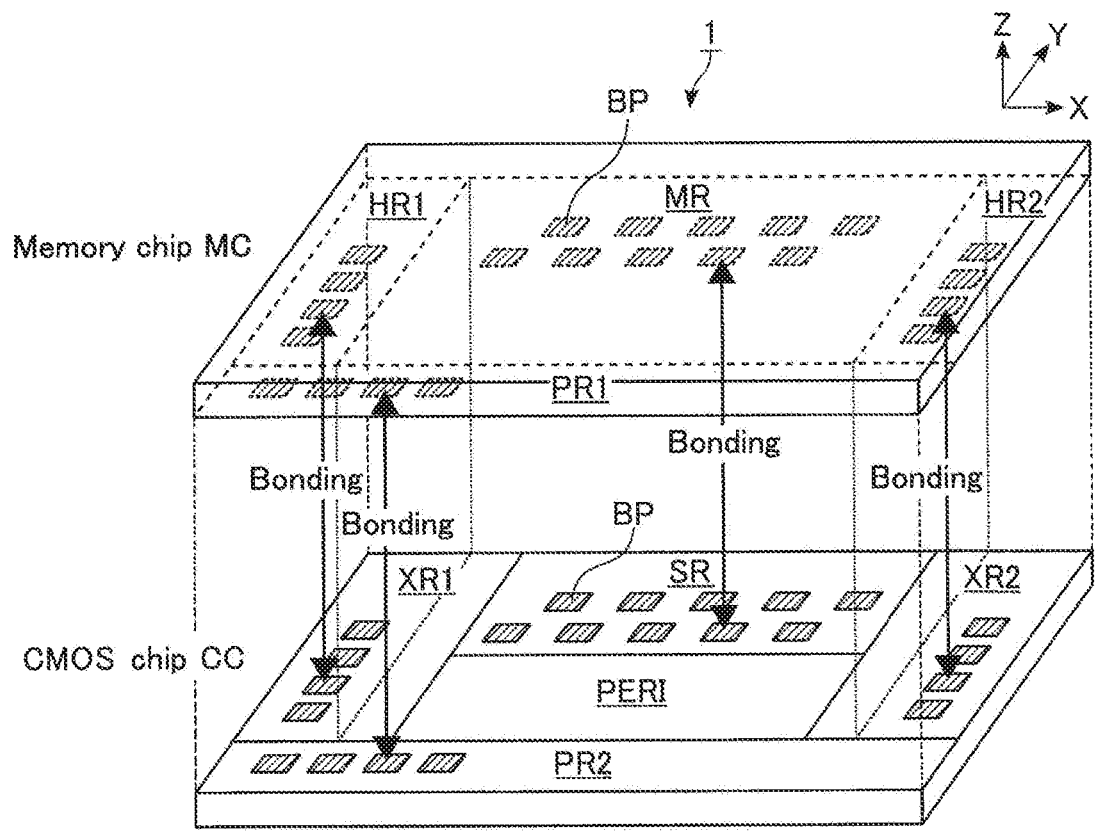
FIG. 6 is a perspective view showing an example of a structure of the semiconductor memory device according to the first embodiment.

FIG. 6 is a block diagram illustrating an example of an overall structure of the semiconductor memory device 1 according to the first embodiment. As shown in FIG. 6, the semiconductor memory device 1 includes a memory chip MC and a CMOS chip CC, and has a structure in which the lower surface of the memory chip MC and the upper surface of the CMOS chip CC are bonded to each other. The memory chip MC includes a structure that corresponds to the memory cell array 10. The CMOS chip CC includes, for example, a command register 11, an address register 12, a sequencer 13, a sense amplifier module 14, a driver module 15 and a structure corresponding to the row decoder module 16.

The region of the memory chip MC is divided into, for example, a memory region MR, hookup regions HR1 and HR2 and a pad region PR1. The memory region MR occupies most of the memory chip MC and is used for storing data. For example, the memory region MR includes a plurality of NAND strings NS. The hookup regions HR1 and HR2 sandwich the memory region MR in the X direction. The hookup regions HR1 and HR2 are used for the coupling between the stacked wirings of the memory chip MC and the row decoder module 16 of the CMOS chip CC. The pad region PR1 is adjacent to the memory region MR and hookup regions HR1 and HR2 in the Y direction. The pad region PR1 includes, for example, a circuit related to the input/output circuit of the semiconductor memory device 1.

The memory chip MC has a plurality of bonding pads BP on the lower portions of the memory region MR, hookup regions HR1 and HR2 and pad region PR1. The bonding pads BP are also referred to as bonding metals, for example. The bonding pads BP on the memory region MR are coupled to the associated bit lines BL. The bonding pads BP on the hookup regions HR are coupled to the associated wirings (e.g., word lines WL) of the stacked wirings provided in the memory region MR. The bonding pads BP on the pad region PR1 are coupled to pads (not shown) provided on the memory chip MC. The pads provided on the memory chip MC are used, for example, for the coupling between the semiconductor memory device 1 and the memory controller 2.

The region of the CMOS chip CC is divided into, for example, a sense amplifier region SR, a peripheral circuit region PERI, transfer regions XR1 and XR2 and a pad region PR2. The sense amplifier region SR and the peripheral circuit region PERI are arranged adjacent to each other in the Y direction and overlap the memory region MR. The sense amplifier region SR includes the sense amplifier module 14. The peripheral circuit region PERI includes the sequencer 13, etc. The transfer regions XR1 and XR2 sandwich the sense amplifier region SR and the peripheral circuit region PERI in the X direction, and overlap the hookup regions HR1 and HR2, respectively. The transfer regions XR1 and XR2 include a plurality of transistors TR provided in the row decoder module 16. The pad region PR2 is arranged in such a manner as to overlap the pad region PR1 of the memory chip MC, and includes the input/output circuit of the semiconductor memory device 1, etc.

The CMOS chip CC has a plurality of bonding pads BP on the upper portions of the sense amplifier region SR, peripheral circuit region PERI, transfer regions XR1 and XR2 and pad region PR2. The plurality of bonding pads BP of the sense amplifier region SR are arranged in such a manner as to overlap the plurality of bonding pads BP of the memory region MR. The plurality of bonding pads BP of the transfer region XR1 are arranged in such a manner as to overlap the plurality of bonding pads BP of the hookup region HR1. The plurality of bonding pads BP of the transfer region XR2 are arranged in such a manner as to overlap the plurality of bonding pads BP of the hookup region HR2. The plurality of bonding pads BP of the pad region PR1 are arranged in such a manner as to overlap the plurality of bonding pads BP of the pad region PR2.

Of the plurality of bonding pads BP provided in the semiconductor memory device 1, two bonding pads BP facing each other between the memory chip MC and the CMOS chip CC are bonded ("bonding" in FIG. 6). As a result, the circuits in the memory chip MC and the circuits in the CMOS chip CC are electrically coupled. A pair of bonding pads BP facing each other between the memory chip MC and the CMOS chip CC may have a boundary or may be integrated In the semiconductor memory device 1 according to the first embodiment, the widths of the hookup regions HR as viewed in the X direction are different from the widths of the transfer regions XR as viewed in the X direction. Specifically, the width of transfer region XR1 as viewed in the X direction is greater than the width of hookup region HR1 as viewed in the X direction, and the width of transfer region XR2 as viewed in the X direction is greater than the width of hookup region HR2 as viewed in the X direction. That is, part of transfer region XR1 and part of transfer region XR2 overlap the memory region MR. Therefore, the bonding pads BP of transfer region XR1 are arranged only in the area that overlaps hookup region HR1, and the bonding pads BP of transfer region XR2 are arranged only in the area that overlaps hookup region HR2.

It should be noted that the semiconductor memory device 1 according to the first embodiment is not limited to the structure described above. For example, at least one hookup region HR adjacent to the memory region MR may be provided. In addition, the semiconductor memory device 1 may include a plurality of pairs of memory region MR and hookup region HR. In this case, the set of sense amplifier region SR, transfer region XR and peripheral circuit region PERI is properly provided in accordance with how the memory region MR and the hookup region HR are arranged. The memory chip MC and the CMOS chip CC may be arranged in the reversed manner. In this case, the bonding pads BP provided on the upper surface of the memory chip MC and the bonding pads BP provided on the lower surface of the CMOS chip CC are bonded together, and the pads used for external coupling are provided on the CMOS chip CC.

[1-3-2] Structure of Memory Chip MC
(Planar Layout of Memory Chip MC)

Figure 7:
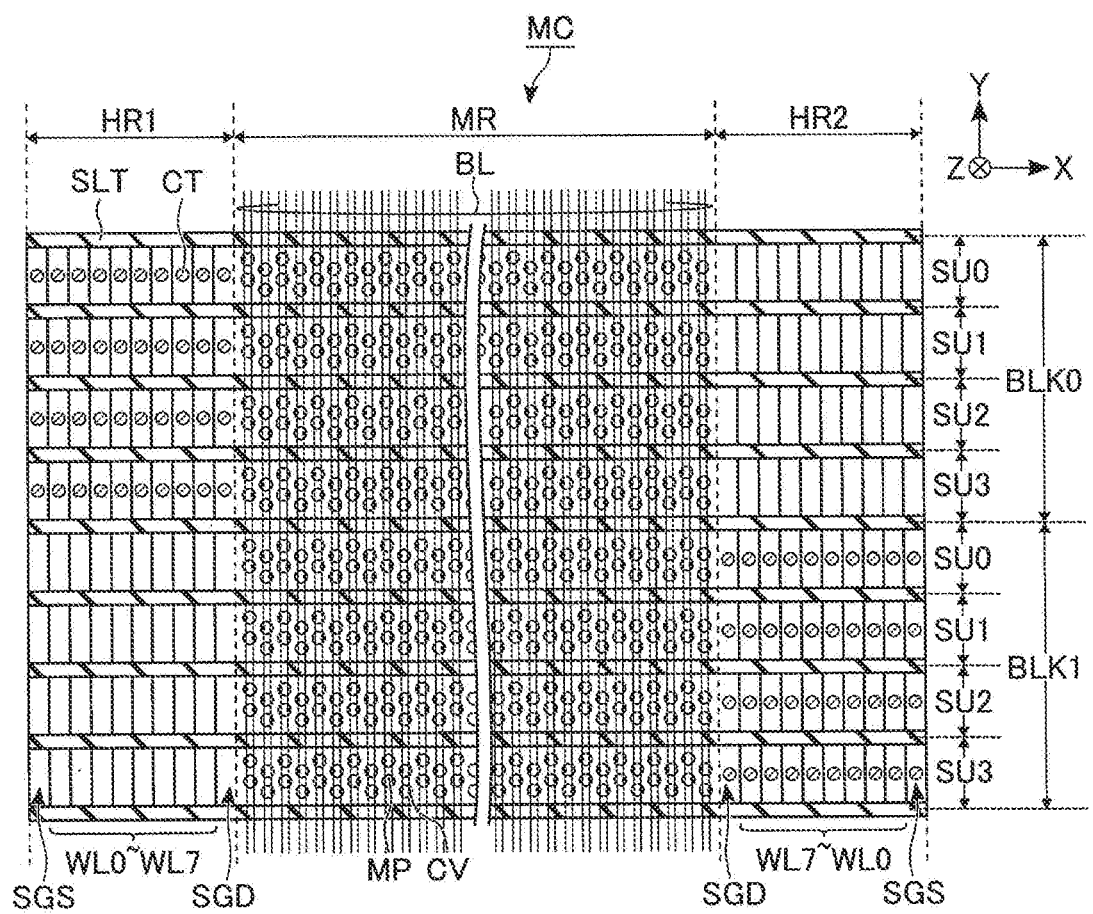
FIG. 7 is a plan view showing an example of a planar layout of a memory chip included in the semiconductor memory device according to the first embodiment.

FIG. 7 shows an example of a planar layout of the memory chip MC of the semiconductor memory device 1 according to the first embodiment, and shows regions corresponding to blocks BLK0 and BLK1. As shown in FIG. 7, the memory chip MC includes a plurality of slits SLT, a plurality of memory pillars MP, a plurality of bit lines BL and a plurality of contacts CT and CV.

The plurality of slits SLT are arranged in the Y direction. Each slit SLT extends along the X direction and crosses the memory region MR and the hookup regions HR1 and HR2. Each slit SLT divides and insulates conductive layers that are adjacent to each other, with the slit SLT interposed. Specifically, the slit SLT divides and insulates a plurality of wiring layers respectively corresponding to the word lines WL0 to WL7 and select gate lines SGD and SGS.

Each of the memory pillars MP functions, for example, as one NAND string NS. In the region which is between the adjacent slits SLT in the memory region MR, the plurality of memory pillars MP are arranged, for example, in four rows and in a staggered fashion. In the present embodiment, each of the regions partitioned by the slits SLT corresponds to one string unit SU. The number of memory pillars MP between the adjacent slits SLT and how they are arranged can be modified as appropriate. The slit SLT sandwiched by the slits SLT arranged at the boundary portions of the block BLK may at least divide the select gate lines SGD.

The bit lines BL extend in the Y direction and are arranged in the X direction. In each string unit SU, each bit line BL overlaps at least one memory pillar MP. In the present embodiment, two bit lines BL are arranged in such a manner as to overlap one memory pillar MP. A contact MPC is provided between one of the bit lines BL overlapping memory pillar MP and the memory pillar MP. Each memory pillar MP is coupled to the associated bit line BL via the contact CV.

In each of the hookup regions HR1 and HR2, each of the select gate line SGS, word lines WL0 to WL7 and select gate line SGD has a portion (terrace portion) that does not overlap the upper wiring layer (conductive layer). In each of the hookup regions HR1 and HR2, the portion that does not overlap the upper wiring layer is similar to a step, a terrace, a rimstone or the like. Specifically, a step is provided between select gate line SGS and word line WL0, between word line WL0 and word line WL1, . . . , between word line WL6 and word line WL7, between word line WL7 and select gate line SGD.

Each contact CT is used for the coupling between the row decoder module 16 and each of the word lines WL0 to WL7 and select gate lines SGS and SGD. Further, each contact CT is arranged on the terrace portion of one of the word lines WL0 to WL7 and select gate lines SGS and SGD. The word line WL and the select gate line SGS used as common wiring in the same block BLK are short-circuited via the wiring layer coupled to the contact CT.

For example, the contact CT associated with block BLK0 is arranged in hookup region HR1, and the contact CT associated with block BLK1 is arranged in hookup region HR2. In other words, for example, even-numbered blocks BLK are coupled to the row decoder module 16 via the contact CT in hookup region HR1, and odd-numbered blocks BLK are coupled to the row decoder module 16 via the contact CT in hookup region HR2.

The planar layout of the memory chip MC described above is repeatedly arranged in the Y direction in the memory region MR and the hookup regions HR1 and HR2. The arrangement of the contacts CT for the respective blocks BLK is not limited to the layout described above. For example, if one hookup region HR is omitted, the contacts CT corresponding to the respective blocks BLK are collectively arranged in the one-side hookup region HR that is in contact with the memory region MR. In addition, the contacts CT may be arranged on both sides of the hookup regions HR1 and HR2, and a voltage may be applied from both sides of each block BLK. A hookup region HR may be arranged such that it is sandwiched by the memory regions MR. The structure in which the hookup region HR is sandwiched by the memory regions MR will be described in connection with the second embodiment.

(Sectional Structure of Memory Chip MC)

Figure 8:
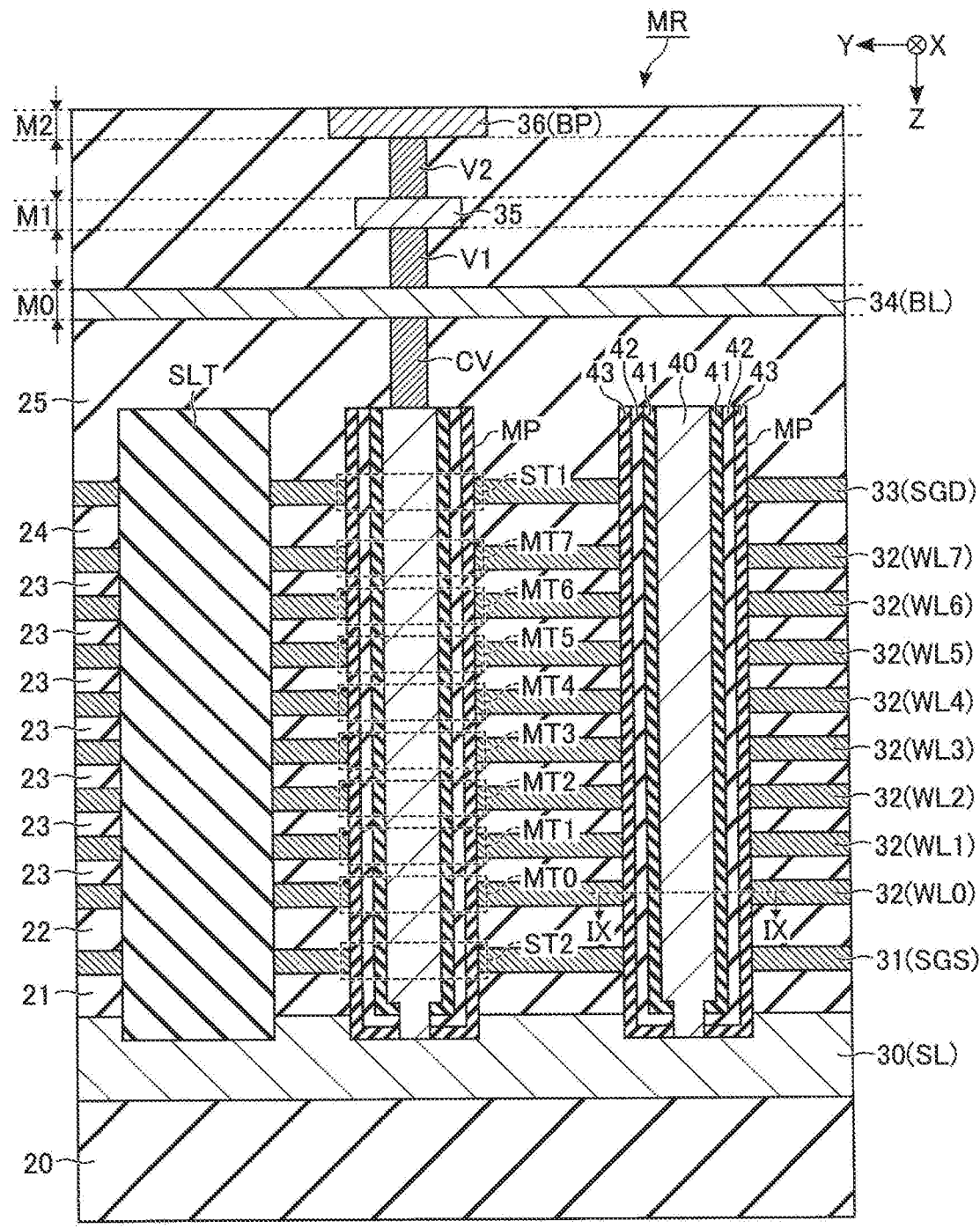
FIG. 8 is a sectional view showing an example of a sectional structure of a memory region of the semiconductor memory device according to the first embodiment.

FIG. 8 shows an example of a sectional structure of the memory region MR of the semiconductor memory device 1 according to the first embodiment, and shows a section including memory pillars MP and slit SLT and being along the Y direction. The Z direction in FIG. 8 is opposite to that shown in FIG. 6. That is, "upper" corresponds to the lower side of the drawing sheet of FIG. 8, and "lower" corresponds to the upper side of the drawing sheet. As shown in FIG. 8, in the memory region MR, the memory chip MC further includes insulating layers 20 to 25, conductive layers 30 to 36 and contacts V1 and V2.

The insulating layer 20 is provided, for example, in the uppermost layer of the memory chip MC. However, this structure is not restrictive, and a wiring layer, an insulating layer, or the like may be provided on the insulating layer 20. The conductive layer 30 is provided below the insulating layer 20. The conductive layer 30 is formed, for example, as a plate shape extending along the X-Y plane, and is used as source line SL. The conductive layer 30 includes, for example, polysilicon doped with phosphorus.

The insulator layer 21 is provided below the conductive layer 30. The conductive layer 31 is provided below the insulating layer 21. The conductive layer 31 is formed, for example, as a plate shape extending along the X-Y plane, and is used as select gate line SGS. The select gate line SGS may be constituted by a plurality of conductive layers 31. The conductive layer 31 includes, for example, polysilicon doped with phosphorus. Where the select gate line SGS is constituted by a plurality of conductive layers 31, the plurality of conductive layers 31 may be conductors that are different from each other.

The insulator layer 22 is provided below the conductive layer 31. The conductive layers 32 and the insulating layers 23 are alternately provided below the insulating layer 22. Each of the plurality of conductive layers 32 is formed, for example, as a plate shape extending along the X-Y plane. The plurality of conductive layers 32 are respectively used as word lines WL0 to WL7 in order from the conductive layer 30 side. the conductive layers 32 contain, for example, tungsten (W).

The insulator layer 24 is provided below the lowermost conductive layer 32. The conductive layer 33 is provided below the insulating layer 24. The conductive layer 33 is formed, for example, as a plate shape extending along the X-Y plane, and is used as select gate line SGD. The select gate line SGS may be constituted by a plurality of conductive layers 33. The conductive layers 33 contain, for example, tungsten (W).

The insulator layer 25 is provided below the conductive layer 33. The conductive layer 34 is provided below the insulating layer 25. The conductive layer 34 is formed, for example, as a line extending in the Y direction, and is used as bit line BL. That is, in the region that is not shown, a plurality of conductive layers 34 are arranged in the X direction. The conductive layers 34 contain, for example, copper. In the description below, the wiring layer provided with the conductive layers 34 will be referred to as M0.

Each memory pillar MP is provided to extend in the Z direction and penetrates the insulating layers 21 to 24 and the conductive layers 31 to 33. The upper portion of memory pillar MP is in contact with the conductive layer 30. Each memory pillar MP includes, for example, a semiconductor layer 40, a tunnel insulating film 41, an insulating film 42 and a block insulating film 43.

The semiconductor layer 40 is provided to extend in the Z direction. For example, the lower end of the semiconductor layer 40 is included in a layer including the insulating layer 25, and the upper end of the semiconductor layer 40 is in contact with the conductive layer 30. The tunnel insulating film 41 covers the side surface of the semiconductor layer 40. The insulating film 42 covers the side surface of the tunnel insulating film 41. The block insulating film 43 covers the side surface of the insulating film 42.

The intersection between the memory pillar MP and the conductive layer 31 (select gate line SGS) functions as select transistor ST2. The intersection between the memory pillar MP and each conductive layer 32 (word line WL) functions as memory cell transistor MT. The intersection between the memory pillar MP and the conductive layer 33 (select gate line SGD) functions as select transistor ST1. That is, the semiconductor layer 40 functions as channels of the memory cell transistors MT0 to MT7 and select transistors ST1 and ST2. The insulating film 42 functions as charge storage layers of the memory cell transistors MT.

A columnar contact CV is provided below the semiconductor layer 40 of each memory pillar MP. In the illustrated region, the contact CV corresponding to one of the two memory pillars MP is shown. In a region that is not illustrated, a contact CV is coupled to the memory pillar MP to which no contact CV is coupled in the illustrated region. One conductive layer 34 (bit line BL) is in contact with the lower surfaces of contacts CV.

The slit SLT is formed, for example, as a plate shape at least part of which extends along the XZ plane, and divides the insulating layers 21-24 the conductive layers 31 to 33. The lower end of the slit SLT is included in a layer in which the insulating layer 25 is provided. The upper end of the slit SLT is in contact with the conductive layer 30, for example. The slit SLT contains, for example, silicon oxide ($SiO_2$).

A columnar contact V1 is provided below the conductive layer 34. A conductive layer 35 is provided below the contact V1. The conductive layer 35 is a wiring layer used for coupling circuits in the semiconductor memory device 1 together. In the description below, the wiring layer provided with the conductive layer 35 will be referred to as M1.

A conductive layer 36 is provided below the conductive layer 35. The conductive layer 36 is in contact with the interface of the memory chip MC and is used as a bonding pad BP. The conductive layers 36 contain, for example, copper. In the description below, the wiring layer provided with the conductive layer 36 will be referred to as M2.

Figure 9:
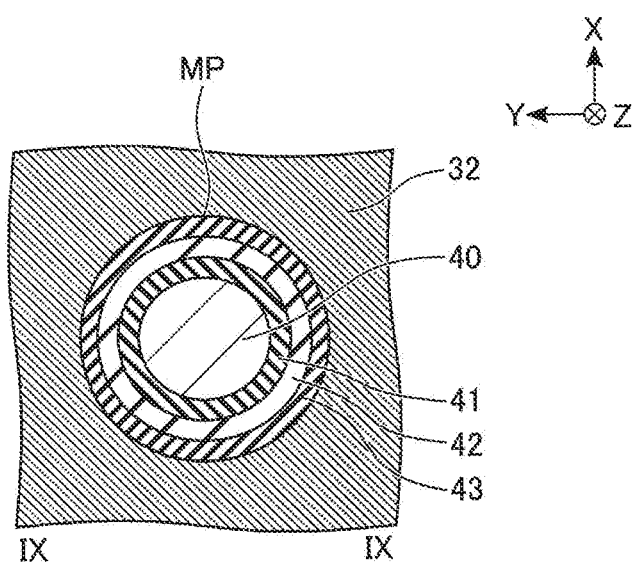
FIG. 9 is a sectional view taken along line IX-IX of FIG. 8 and showing an example of a sectional structure of a memory pillar included in the semiconductor memory device according to the first embodiment.

FIG. 9 is a sectional view taken along line IX-IX of FIG. 8, and shows an example of a sectional structure of memory pillar MP of the semiconductor memory device 1 according to the first embodiment. Specifically, FIG. 9 shows a section that includes the memory pillar MP and the conductive layer 32 and that is parallel to the surface of the semiconductor substrate used for forming the semiconductor memory device 1.

As shown in FIG. 9, the semiconductor layer 40 is provided, for example, in the central portion of the memory pillar MP. The tunnel insulating film 41 covers the side surface of the semiconductor layer 40. The insulating film 42 covers the side surface of the tunnel insulating film 41. The block insulating film 43 covers the side surface of the insulating film 42. The conductive layer 32 covers the side surface of the block insulating film 43. Each of the tunnel insulating film 41 and the block insulating film 43 contains, for example, silicon oxide ($SiO_2$). The insulating film 42 contains, for example, silicon nitride (SiN). It should be noted that each memory pillar MP may further include an insulating layer inside the semiconductor layer 40, and the insulating layer may be located at the center of the memory pillar MP. That is, the semiconductor layer 40 may have a cylindrical portion.

Figure 10:
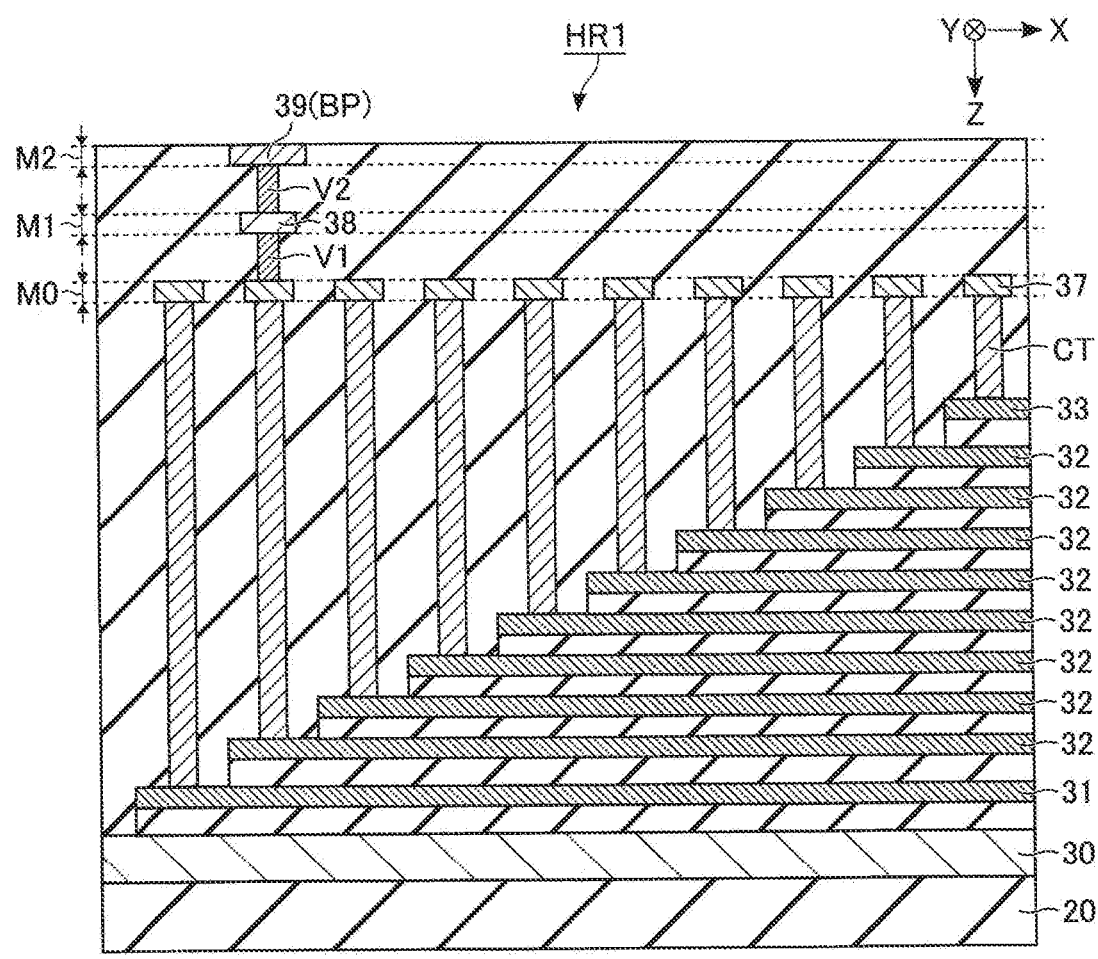
FIG. 10 is a sectional view showing an example of a sectional structure of a hookup region included in the semiconductor memory device according to the first embodiment.

FIG. 10 shows an example of a sectional structure of hookup region HR1 of the semiconductor memory device 1 according to the first embodiment, and shows a section corresponding to an even-numbered block BLK included in the hookup region HR1. Like the Z direction in FIG. 8, the Z direction in FIG. 10 is opposite to that shown in FIG. 6. As shown in FIG. 10, in the hookup region HR1, the end portions of select gate line SGS, word lines WL0 to WL7 and the select gate line SGD are provided like a staircase. In the hookup region HR, the memory chip MC further includes contacts V1 and V2 and conductive layers 37 to 39.

Specifically, the conductive layer 31 has a terrace portion that does not overlap the conductive layers 32 and 33 provided below. Specifically, each conductive layer 32 has a terrace portion that does not overlap the conductive layers 32 and 33 provided below. In the hookup region HR1, the conductive layer 33 has a terrace portion. A plurality of contacts CT are provided on the terrace portions of the respective conductive layers 31 to 33. For example, the lower portions of the plurality of contacts CT are aligned.

The conductive layer 37 is provided below each contact CT. The conductive layer 37 is included in wiring layer M0. The contact V1 is provided below the conductive layer 37. The conductive layer 38 is provided below the contact V1. The conductive layer 38 is included in wiring layer M1. The contact V2 is provided below the conductive layer 38. The conductive layer 39 is provided below the contact V2. The conductive layer 39 is included in wiring layer M2. That is, the conductive layer 39 is in contact with the interface of the memory chip MC and is used as a bonding pad BP. The conductive layer 39 contains, for example, copper.

It should be noted that FIG. 10 shows only the set of contacts V1 and V2 and the conductive layers 38 and 39 that corresponds to word line WL0. A set of the contacts V1 and V2 and the conductive layers 38 and 39 is coupled to the other conductive layers 37 in a region that is not illustrated. The structure of the region corresponding to an odd-numbered block BLK included in hookup region HR1 is similar to the structure shown in FIG. 10 except that contacts CT are omitted. The structure of the region corresponding to an odd-numbered block BLK included in hookup region HR2 is similar to the structure obtained by inverting the structure shown in FIG. 10 with the Y direction as an axis of symmetry.

[1-3-3] Structure of CMOS Chip CC (Planar Layout of CMOS Chip CC)

Figure 11:
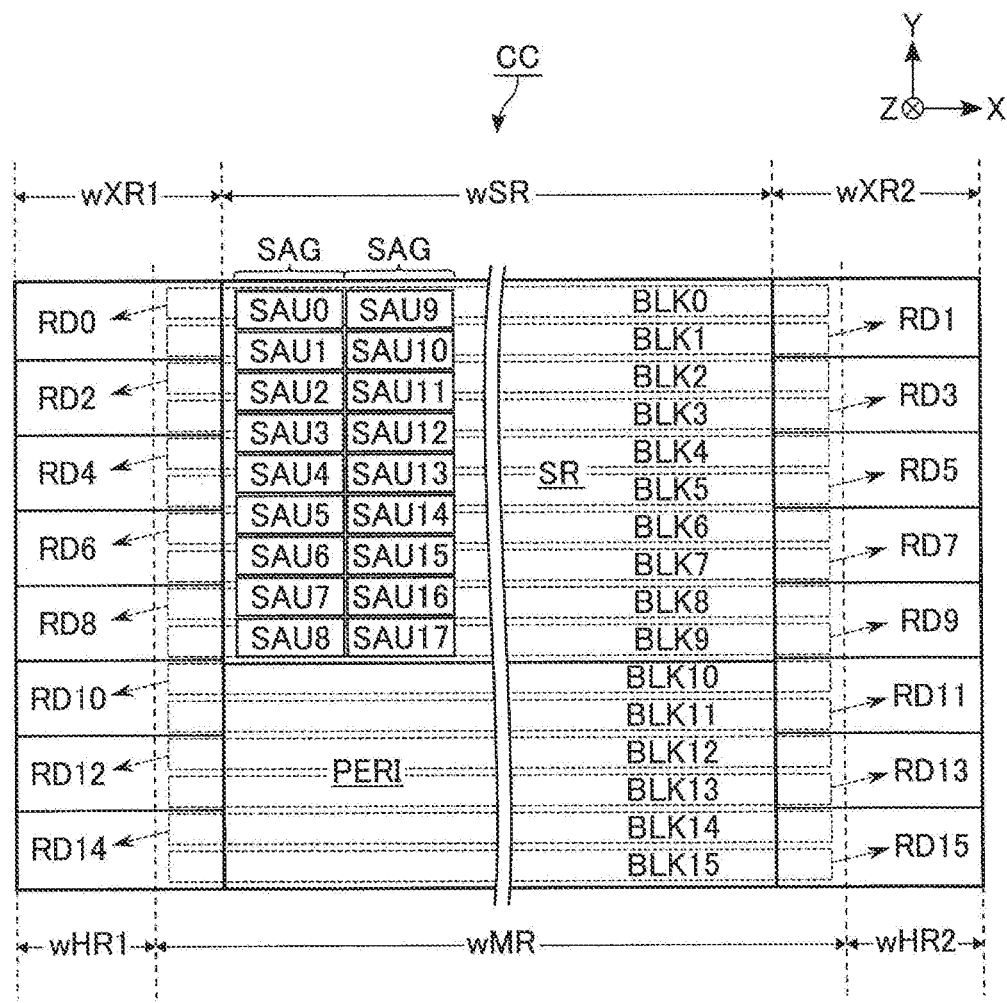
FIG. 11 is a plan view showing an example of a planar layout of a CMOS chip included in the semiconductor memory device according to the first embodiment.

FIG. 11 shows an example of a planar layout of a CMOS chip CC of the semiconductor memory device 1 according to the first embodiment, and shows how blocks BLK, sense amplifier units SAU and row decoders RD are coupled. In the drawings referred to below, the ranges in which regions MR, HR1, HR2, SR, XR1 and XR2 are provided in the X direction are indicated as regions wMR, wHR1, wHR2, wSR, wXR1 and wXR2, respectively. For simplification of description, reference will be made to a case where the memory cell array 10 includes sixteen blocks BLK0 to BLK15 and the row decoder module 16 includes row decoders RD0 to RD15.

As shown in FIG. 11, in the sense amplifier region SR, for example, a set of nine sense amplifier units SAU aligned in the Y direction are arranged in the X direction. Specifically, the sense amplifier units SAU0 to SAU8 are arranged in the Y direction, for example, at the end of the sense amplifier region SR on the transfer region XR1 side. Sense amplifier units SAU9 to SAU17 are arranged next to sense amplifier units SAU0 to SAU8, respectively. Likewise, although not shown, sense amplifier units SAU18 to SAU26, . . . and sense amplifier units SAU(m−8) to SAUm are arranged. In this specification, a set of sense amplifier units SAU arranged in the Y direction will be referred to as sense amplifier group SAG.

In the present embodiment, the transfer region XR1 includes even-numbered row decoders RD0, RD2, RD4, RD6, RD8, RD10, RD12 and RD14.

The transfer region XR2 includes odd-numbered row decoders RD1, RD3, RD5, RD7, RD9, RD11, RD13 and RD15. For example, row decoders RD0, RD2, RD4, RD6, RD8, RD10, RD12 and RD14 are respectively opposed to row decoders RD1, RD3, RD5, RD7, RD9, RD11, RD13 and RD15 in the X direction, with the sense amplifier region SR in between.

In the memory region MR, the blocks BLK0 to BLK15 are arranged in the Y direction. The blocks BLK0 to BLK15 are controlled by row decoders RD0 to RD15, respectively, as described above. That is, the even-numbered blocks BLK are controlled by the row decoders RD arranged in the transfer region XR1, and the odd-numbered blocks BLK are controlled by the row decoders RD arranged in the transfer region XR2.

The width of each block BLK as viewed in the Y direction is, for example, half or less of the width of row decoder RD as viewed in the Y direction. In this example, two blocks BLK0 and BLK1 are arranged between the row decoders RD0 and RD1. Two blocks BLK2 and BLK3 are arranged between the row decoders RD2 and RD3. Likewise, two blocks BLK are arranged between two row decoders RD opposed to each other in the X direction.

Portions of blocks BLK0 and BLK1 overlap the row decoders RD0 and RD1. Specifically, the end portions of blocks BLK0 and BLK1 on the hookup region HR1 side overlap the row decoder RD0. On the other hand, the end portions of blocks BLK0 and BLK1 on the hookup region HR2 side overlap the row decoder RD1. Likewise, portions of the two blocks BLK associated with the two row decoders RD opposed to each other are arranged to overlap the two row decoders RD.

The above-mentioned arrangement of the blocks BLK, the sense amplifier units SAU and the row decoders RD is merely an example. For example, the arrangement of the row decoders RD coupled to blocks BLK can be properly changed within the transfer regions XR1 and XR2. The number of sense amplifier units SAU included in one sense amplifier group SAG is determined based on the pitch of the bit lines BL. The detailed relationships between the layout of the sense amplifier units SAU and the layout of the bit lines BL will be described later.

(Sectional Structure of CMOS Chip MC)

Figure 12:
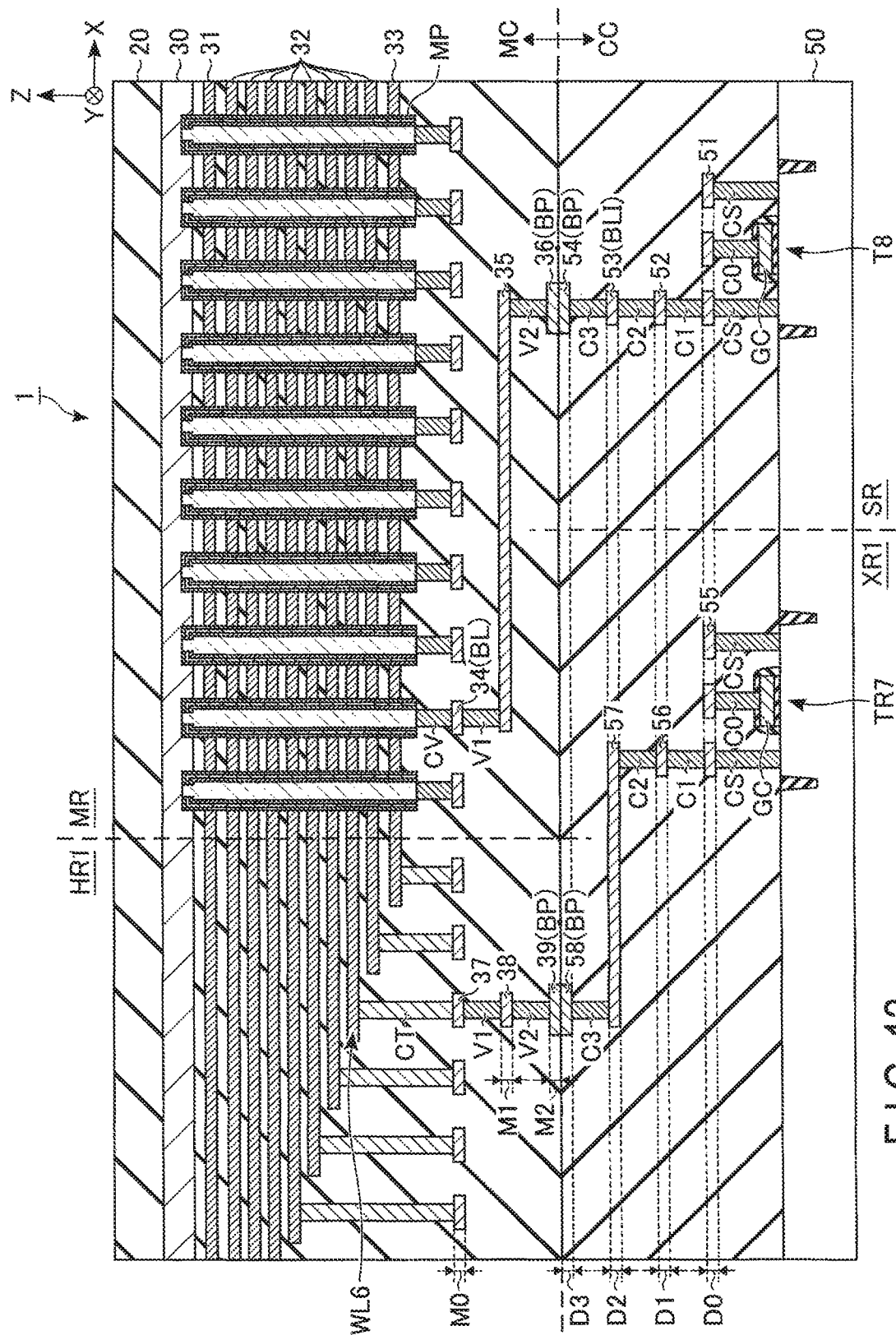
FIG. 12 is a sectional view showing an example of a sectional structure of the semiconductor memory device according to the first embodiment.

FIG. 12 shows an example of a sectional structure of the semiconductor memory device 1 according to the first embodiment, and shows a structure in which a memory chip MC and a CMOS chip CC are bonded to each other. In FIG. 12, a configuration corresponding to transistor T8 in the sense amplifier region SR and a configuration corresponding to transistor TR7 in the transfer region XR1 are extracted and shown. As shown in FIG. 12, the CMOS chip CC includes, for example, a semiconductor substrate 50, conductive layers GC and 51 to 58 and columnar contacts CS and C0 to C3.

The semiconductor substrate 50 is used for forming the CMOS chip CC and contains, for example, p-type impurities. The semiconductor substrate 50 includes a plurality of well regions (not shown). For example, a transistor is formed in each of the plurality of well regions. The plurality of well regions are separated by, for example, an STI (Shallow Trench Isolation).

In the sense amplifier region SR, the conductive layer GC is provided on the semiconductor substrate 50, with a gate insulating film interposed. The conductive layer GC in the sense amplifier region SR is used, for example, as a gate electrode of transistor T8 included in the sense amplifier unit SAU. The contact C0 is provided on the conductive layer GC in correspondence to the gate of transistor T8, and two contacts CS are provided on the semiconductor substrate 50 in correspondence to the source and drain of transistor T8. For example, the upper surfaces of contacts CS and C0 are aligned.

In the sense amplifier region SR, one conductive layer 51 is provided on each of contacts CS and contact C0. The contact C1 is provided on the conductive layer 51. The conductive layer 52 is provided on the contact C1. The contact C2 is provided on the conductive layer 52. The conductive layer 53 is provided on the contact C2. The contact C3 is provided on the conductive layer 53. The conductive layer 54 is provided on the contact C3.

The conductive layer 54 is in contact with the interface of the CMOS chip CC and is used as a bonding pad BP. The conductive layer 54 in the sense amplifier region SR is bonded to the conductive layer 36 opposed thereto in the memory region MR, and is electrically coupled to one bit line BL. The conductive layer 54 contains, for example, copper. Although not shown, the sense amplifier region SR includes a plurality of transistors having the same structure as the transistor T8.

In the transfer region XR1, the conductive layer GC is provided on the semiconductor substrate 50, with a gate insulating film interposed. The conductive layer GC in the transfer region XR1 is used, for example, as a gate electrode of transistor TR7 included in the row decoder RD. The contact C0 is provided on the conductive layer GC in correspondence to the gate of transistor TR7, and two contacts CS are provided on the semiconductor substrate 50 in correspondence to the source and drain of transistor TR7.

In the transfer region XR1, one conductive layer 55 is provided on each of contacts CS and contact C0. The contact C1 is provided on the conductive layer 55. The conductive layer 56 is provided on the contact C1. The contact C2 is provided on the conductive layer 56. The conductive layer 57 is provided on the contact C2. The contact C3 is provided on the conductive layer 57. The conductive layer 58 is provided on the contact C3.

The conductive layer 58 is in contact with the interface of the CMOS chip CC and is used as a bonding pad BP. The conductive layer 58 in the transfer region XR1 is bonded to the conductive layer 39 opposed thereto in the hookup region HR1, and is electrically coupled to, for example, the word line WL6. The conductive layer 58 contains, for example, copper. Although not shown, the transfer region XR1 includes a plurality of transistors having the same structure as the transistor TR7. The structure of transfer region XR2 is similar to that of transfer region XR1.

In the description below, the wiring layer provided with the conductive layers 51 and 55 will be referred to as D0. The wiring layer provided with the conductive layers 52 and 56 will be referred to as D1. The wiring layer provided with the conductive layers 53 and 57 will be referred to as D2. The wiring layer provided with the conductive layers 54 and 58 will be referred to as D3. The conductive layer 53 is also referred to as wiring BLI. The number of wiring layers provided in the CMOS chip CC can be designed to be an arbitrary number. The contacts coupled to the conductive layers 51 to 53 and 55 to 57 may be omitted depending on the circuit design.

The semiconductor memory device 1 according to the first embodiment includes transistors TR arranged below the memory region MR. That is, the plurality of transistors TR in the row decoder RD may include transistors TR arranged below the memory pillar MP and transistors TR arranged below the hookup region HR1. For example, the conductive layer 57 coupled to transistor TR arranged below the memory region MR has a portion extending in the X direction in wiring layer D2. The conductive layer 35 coupled to the memory pillar MP arranged above transistor TR has a portion extending in the X direction in wiring layer M1.

Although the path coupling bit line BL and transistor T8 and the path coupling the word line WL7 and the transistor TR6 were described above, these paths are merely examples. A wiring used for the coupling between bit line BL and sense amplifier unit SAU and extending in the X direction may be provided on the CMOS chip CC side. Also, a wiring used for the coupling between the row decoder RD and any one of word lines WL and any one of select gate lines SGD and SGS and extending in the X direction may be provided on the memory chip MC side. In this manner, the layout of the wiring used for coupling the circuits in the memory chip MC and the circuits in the CMOS chip CC can be changed as appropriate.

[1-3-4] Details of Wiring Layout

In the description below, a specific example of the wiring layout between the hookup region HR and the transfer region XR and a specific example of the wiring layout between the memory region MR and the sense amplifier region SR will be mentioned.

(Wiring Layout between Hookup Region HR and Transfer Region XR)

Figure 13:
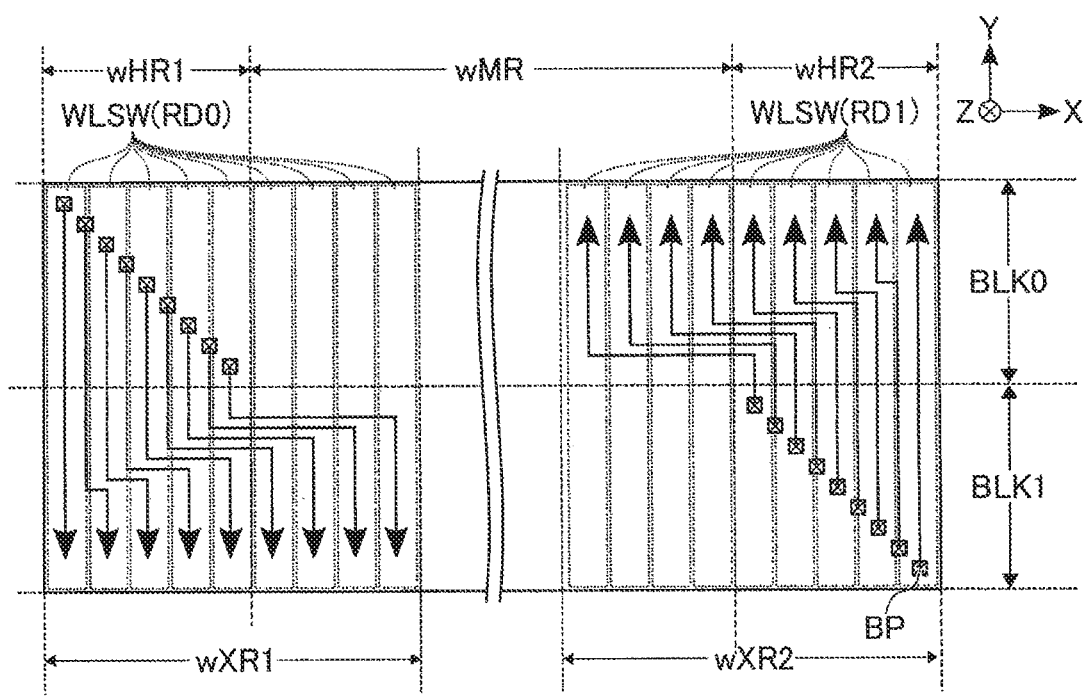
FIG. 13 is a plan view showing an example of a planar layout of a hookup region and a transfer region included in the semiconductor memory device according to the first embodiment.

FIG. 13 shows an example of a planar layout of the hookup regions HR and transfer region XR of the semiconductor memory device 1 according to the first embodiment, and extracts and shows the region corresponding to blocks BLK0 and BLK1. It should be noted that in FIG. 13, the number of bonding pads BP provided in the hookup region HR and the number of transfer switches WLSW included in the transfer region XR are reduced for simplification of the drawing. In the description below, "outside" corresponds to a portion far from the memory region MR, and "inside" corresponds to a portion near the middle portion of the memory region MR.

As shown in FIG. 13, in the region of row decoder RD0 included in the transfer region XR1, a plurality of transfer switches WLSW are provided, for example, in regions extending in the Y direction and are arranged in the X direction. Likewise, in the region of row decoder RD1 included in the transfer region XR2, a plurality of transfer switches WLSW are provided, for example, in regions extending in the Y direction and are arranged in the X direction. In the first embodiment, some of the plurality of transfer switches WLSW included in the transfer regions XR1 and XR2 overlap the memory region MR.

The plurality of bonding pads BP corresponding to the block BLK0 are provided, for example, in hookup region HR1. The stacked wirings corresponding to the block BLK0 are coupled to the transfer switches WLSW in the transfer region XR1 via the bonding pads BP in the hookup region HR1. For example, in the hookup region HR1, bonding pads BP on the outer side are coupled to transfer switches WLSW on the outer side, and the bonding pads BP on the inner side are coupled to the transfer switches WLSW on the inner side.

Likewise, the plurality of bonding pads BP corresponding to the block BLK1 are provided, for example, in the hookup region HR2. The stacked wirings corresponding to the block BLK1 are coupled to the transfer switches WLSW in the transfer region XR2 via the bonding pads BP in the hookup region HR2. For example, in the hookup region HR2, bonding pads BP on the outer side are coupled to transfer switches WLSW on the outer side, and the bonding pads BP on the inner side are coupled to the transfer switches WLSW on the inner side.

Figure 14:
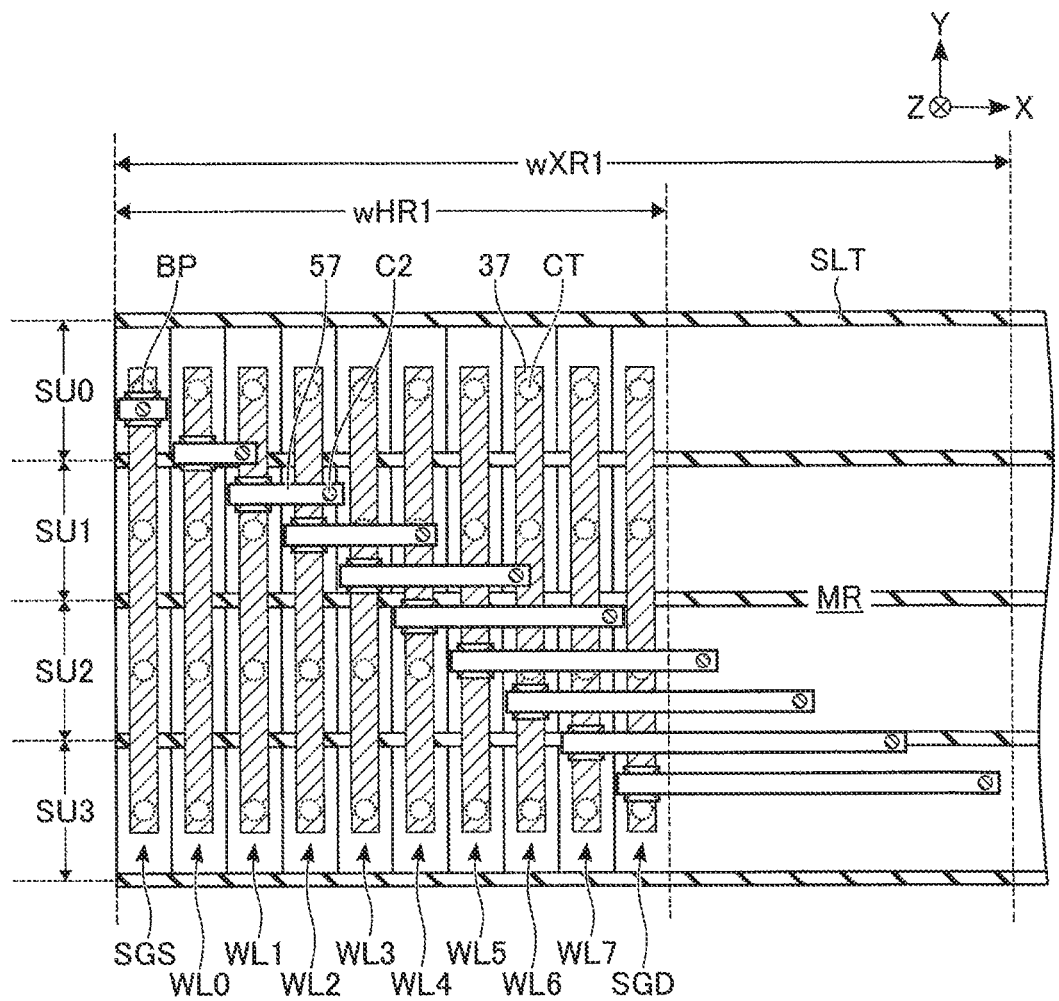
FIG. 14 is a plan view showing an example of a detailed planar layout of the hookup region and transfer region included in the semiconductor memory device according to the first embodiment.

FIG. 14 shows an example of a detailed planar layout of the hookup region HR1 and the transfer region XR of the semiconductor memory device 1 according to the first embodiment, and extracts and shows the region corresponding to one block BLK (namely, string units SU0 to SU3). As shown in FIG. 14, the conductive layers provided in the same wiring layer of the same block BLK are short-circuited, for example, by the conductive layers 37 extending in the Y direction.

Bonding pad BP is arranged to overlap each conductive layer 37. For example, the plurality of bonding pads BP are arranged such that they are shifted from each other in both the X direction and the Y direction. In other words, the plurality of bonding pads BP are arranged diagonally. However, this arrangement is not restrictive, and the plurality of bonding pads BP may be classified into a plurality of groups and may be diagonally arranged in each group. The conductive layers 57 are coupled to the respective bonding pads BP via the contacts C2.

The length of each conductive layer 57 depends on the position of the terrace portion of the associated wiring. Specifically, the X-direction length of the conductive layer 57 coupled to the select gate line SGS is less than the X-direction length of the conductive layer 57 coupled to the word line WL0. The X-direction length of the conductive layer 57 coupled to the word line WL0 is less than the X-direction length of the conductive layer 57 coupled to the word line WL1. Likewise, the length of the conductive layer 57 is designed as appropriate according to the arrangement of the transfer switch WLSW and bonding pad BP.

For example, part of the wirings for coupling the bonding pads BP and the transfer switches WLSW are designed such that portions extending in the X direction are shorter as the wirings are arranged on the outer side. In the present embodiment, the conductive layers 57 coupled to select gate lines SGD overlap both transfer region XR1 and hookup region HR1. On the other hand, the conductive layer 57 coupled to select gate line SGS overlaps only hookup region HR1.

In the above description, reference was made to the example in which the wirings having different wiring lengths in the X direction are the conductive layers 57, but this example is not restrictive. In the semiconductor memory device 1 according to the first embodiment, the design of the conductive layers 57 described above may be applied to other conductive layers used for the coupling between the bonding pads BP and the transfer switches WLSW.

(Wiring Layout Between Memory Region MR and Sense Amplifier Region SR)

Figure 15:
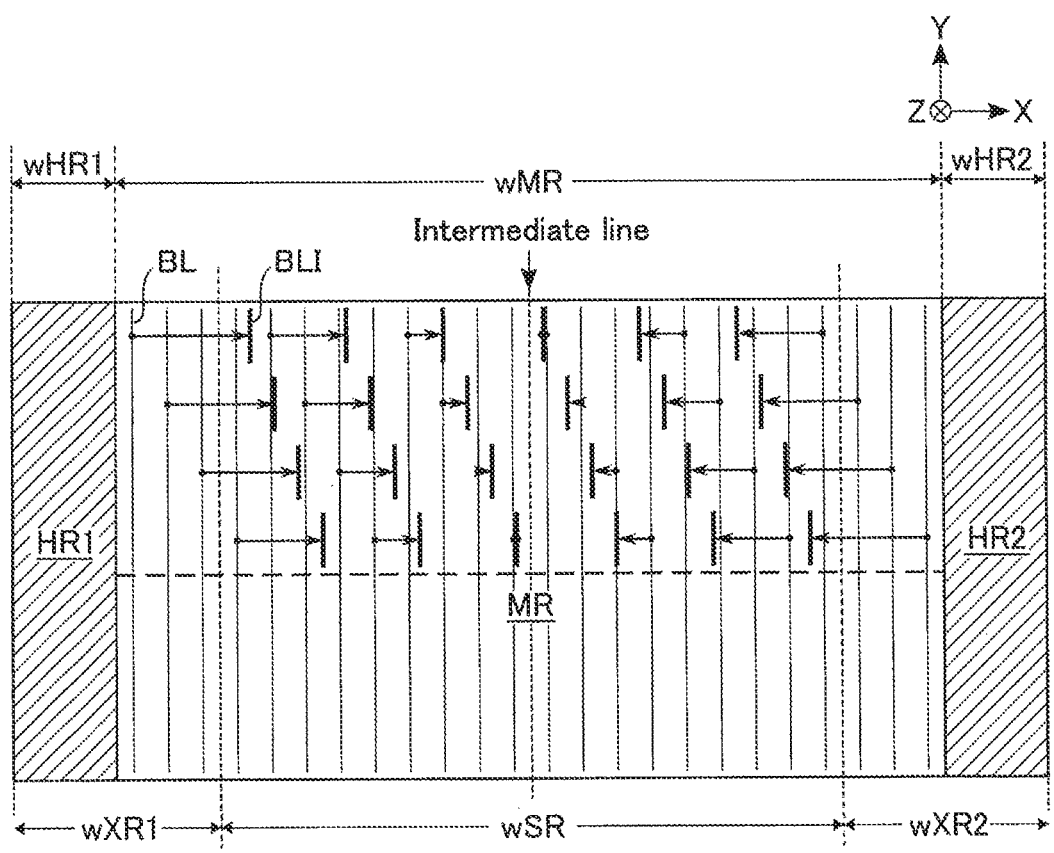
FIG. 15 is a plan view showing an example of a planar layout of a memory region and a sense amplifier region included in the semiconductor memory device according to the first embodiment.

FIG. 15 shows an example of a planar layout of the semiconductor memory device 1 according to the first embodiment, and shows regions corresponding to memory region MR and hookup regions HR1 and HR2. In FIG. 15, the lengths of the wirings (e.g., conductive layers 35) between bit lines BL wirings BLI are indicated by arrows, and part of the bit lines provided in the memory region MR and part of the wirings BLI coupled to the bit lines BL are not illustrated for simplicity of the drawing.

As shown in FIG. 15, in the memory region MR, the plurality of bit lines BL are arranged at equal intervals in the X direction. In the sense amplifier region SR, the plurality of wirings BLI are arranged at equal intervals in the X direction. Further, each of the plurality of wirings BLI is divided into a plurality of portions along the Y direction. The number of portions of wiring BLI along the Y direction is based on, for example, the number of sense amplifier units SAU arranged in the Y direction. In FIG. 15, only the wirings BLI associated with the illustrated bit lines BL are shown.

In the region that is inside the memory region MR and depicted on the left side of the drawing sheet, the bit lines BL arranged on the outermost side overlap transfer region XR1. In the region that is inside the memory region MR and depicted on the right side of the drawing sheet, the bit lines BL arranged on the outermost side overlap transfer region XR2. The lengths of the wirings for coupling the bit lines BL and wirings BLI are determined such that the length of the wirings located on the outer sides of the memory region MR and the length of the wirings located in the vicinity of the intermediate line of the memory region MR are different.

Specifically, in the region that is inside the memory region MR and located on the left side of the drawing sheet, the wirings for coupling the bit lines BL arranged on the outer side of the memory region MR and the wirings BLI are longer than the wirings for coupling the bit lines BL arranged near the intermediate line and the wirings BLI. Likewise, in the region that is inside the memory region MR and located on the right side of the drawing sheet, the wirings for coupling the bit lines BL arranged on the outer side of the memory region MR and the wirings BLI are longer than the wirings for coupling the bit lines BL arranged near the intermediate line and the wirings BLI. As described above, the lengths of the wirings for coupling the bit lines BL and the wiring BLI are designed such that they decrease from the outer sides of the memory region MR toward the inside (toward the intermediate line of the memory region MR).

Figure 16:
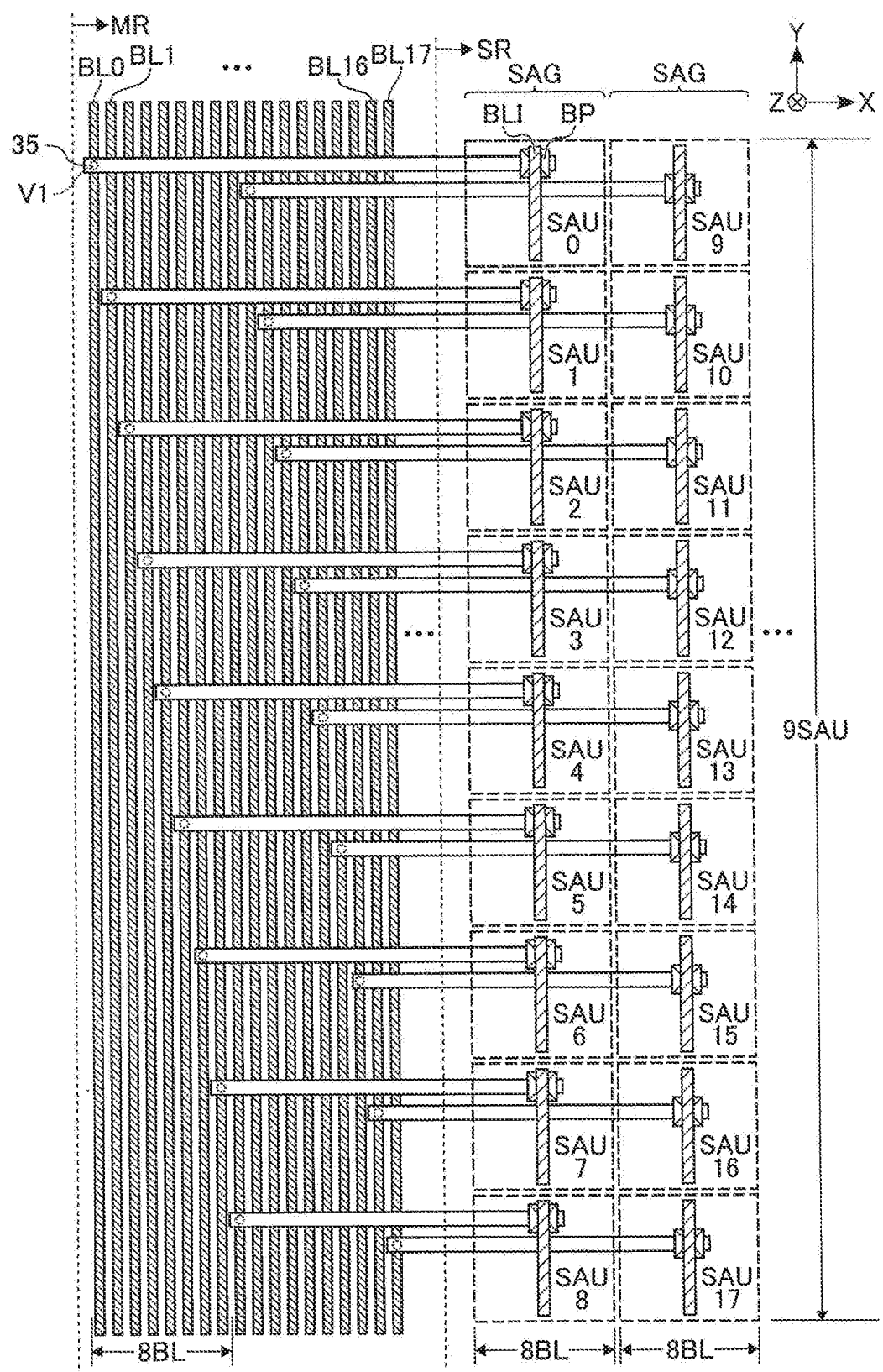
FIG. 16 is a plan view showing an example of a detailed planar layout of the memory region and sense amplifier region included the semiconductor memory device according to the first embodiment.

FIG. 16 shows an example of a detailed planar layout of the memory region MR and sense amplifier region SR of the semiconductor memory device 1 according to the first embodiment, and the region corresponding to two sense amplifier groups SAG arranged at one end of the sense amplifier region SR is extracted and shown. As shown in FIG. 16, in the memory region MR, bit lines BL0 to BL17 are arranged in the X direction. In the sense amplifier region SR, the sense amplifier group SAG including sense amplifier units SAU0 to SAU8 and the sense amplifier group SAG including sense amplifier units SAU9 to SAU17 are arranged in the X direction.

The region of each sense amplifier unit SAU includes one wiring BLI. One bonding pad BP overlaps each wiring BLI. A conductive layer 35 extending in the X direction is coupled to each bonding pad BP. Each conductive layer 35 is coupled to the associated bit line BL via contact V1. The two conductive layers 35 respectively coupled to the two sense amplifier units SAU adjacent in the X direction are adjacent in the Y direction. That is, for example, the conductive layer 35 coupled to sense amplifier unit SAU9 is arranged between the two conductive layers 35 coupled to sense amplifier units SAU0 and SAU1.

The length of conductive layer 35 differs depending on the position of the associated sense amplifier unit SAU. Specifically, the X-direction length of the conductive layer 35 coupled to sense amplifier unit SAU0 is less than the X-direction length of the conductive layer 35 coupled to sense amplifier unit SAU9. Likewise, the lengths of the conductive layers 35 are designed as appropriate according to the arrangement of the bit lines BL and sense amplifier units SAU.

For example, part of the wirings for coupling the bit lines BL and the sense amplifier units SAU are designed such that portions extending in the X direction are longer as the wirings correspond more to the outermost bit line BL. In this example, the conductive layer 35 coupled to bit line BL0 has a portion that is inside the memory region MR and that does not overlap the sense amplifier region SR. Although illustration is omitted, part of the wirings for coupling the bit line BL arranged near the intermediate line of the memory region MR and sense amplifier unit SAU has a portion overlapping only the memory region MR.

In the semiconductor memory device 1 according to the first embodiment, the X-direction length of the sense amplifier unit SAU is designed based on the X-direction length (8BL) that enables formation of eight bit lines BL. In other words, the X-direction length of sense amplifier unit SAU is designed based on the pitch at which eight bit lines BL are formed. On the other hand, sense amplifier group SAG includes nine sense amplifier units SAU arranged in the Y direction (9 SAU).

That is, in the semiconductor memory device 1 according to the first embodiment, the number of bit lines BL used for designing the X-direction length of the sense amplifier unit SAU is less than the number of bit lines BL coupled to one sense amplifier group SAG. As described above, in the semiconductor memory device 1 according to the first embodiment, at least the X-direction length of sense amplifier units SAU may be designed based on the pitch of bit lines BL that are fewer in number than sense amplifier units SAU included in sense amplifier group SAG.

In the above description, reference was made to the case where the wirings having different wiring lengths in the X direction are the conductive layers 35, but this structure is not restrictive. In the semiconductor memory device 1 according to the first embodiment, the design method of the conductive layers 35 described above may be applied to other conductive layers used for the coupling between the bit lines BL and the sense amplifier units SAU.

[1-4] Advantages of First Embodiment

In the semiconductor memory device 1 of the first embodiment described above, the chip area can be reduced and the manufacturing cost of the semiconductor memory device 1 can be suppressed. Detailed advantages of the semiconductor memory device 1 according to the first embodiment will be described.

Roughly speaking, the semiconductor memory device can be divided into a memory cell array and other peripheral circuits. In order to reduce the bit cost of the semiconductor memory device, it is preferable to increase the ratio of the area of the memory cell array to the chip area of the semiconductor memory device (namely, the cell occupancy ratio).

Figure 17:
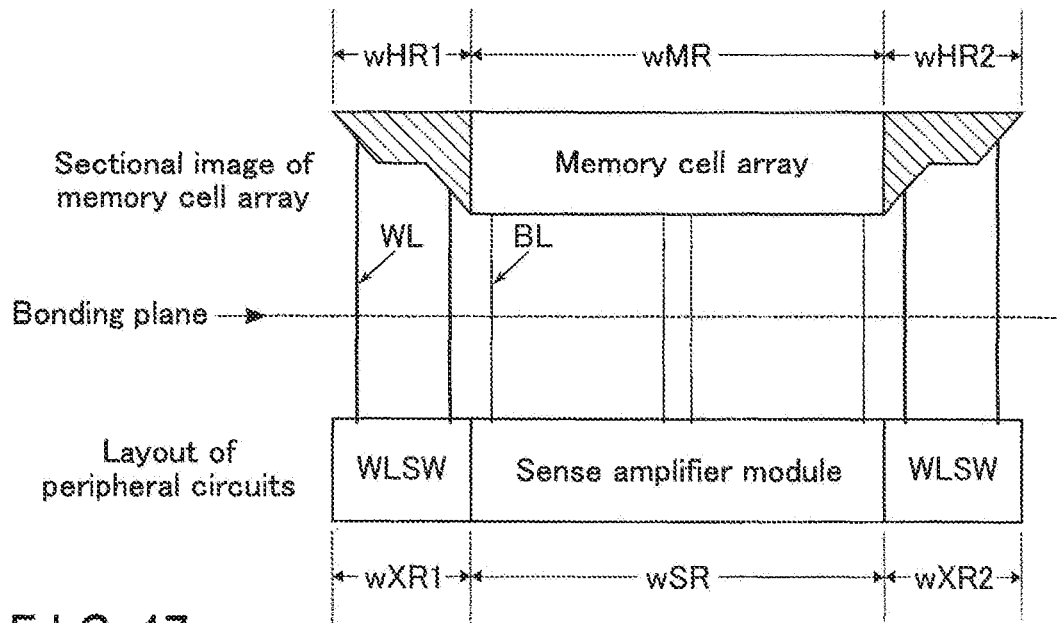
FIG. 17 is a schematic diagram showing an example of a structure of a semiconductor memory device according to a comparative example of the first embodiment.

FIG. 17 is a schematic diagram showing an example of a structure of a semiconductor memory device according to a comparative example of the first embodiment. The upper portion of FIG. 17 corresponds to a sectional image of the memory cell array, and the lower portion of FIG. 17 corresponds to a layout of a peripheral circuit including a sense amplifier module, etc. As shown in FIG. 17, the semiconductor memory device according to the comparative example of the first embodiment includes a memory chip including a memory cell array and a CMOS chip including a peripheral circuit, as in the first embodiment. The memory chip and the CMOS chip are formed on different wafers and are bonded to each other. In FIG. 17, the boundary portion between the memory chip and the CMOS chip is shown as a bonding surface.

As can be seen, the semiconductor memory device according to the comparative example of the first embodiment has a structure in which the memory cell array 10 and the peripheral circuit overlap. As a result, in the semiconductor memory device according to the comparative example of the first embodiment, the cell occupancy ratio can be increased and the chip area can be reduced. In addition, in the semiconductor memory device according to the comparative example of the first embodiment, the heat generated when the memory cell array 10 is formed is not applied to the transistors of the CMOS chip CC, so that the degree of difficulty in designing the transistors in the CMOS chip CC can be reduced. The advantages of the comparative example of the first embodiment described in this paragraph can be similarly obtained in the semiconductor memory device 1 according to the first embodiment.

In the semiconductor memory device according to the comparative example of the first embodiment, the width of the memory region MR and the width of the sense amplifier region SR are designed to be substantially the same, the width of hookup region HR1 and the width of transfer region XR1 are designed to be substantially the same, and the width of hookup region HR2 and the width of transfer region XR2 are designed to be substantially the same. For example, if the number of word lines WL that are stacked is increased to enhance the capacity of the semiconductor memory device, the number of transfer switches WLSW that may be required is also increased.

However, where the number of transfer switches WLSW is increased, the area of transfer region XR can be larger than the area required when the staircase structure of the hookup region HR is formed with the minimum pitch. In this case, the staircase structure of the hookup region HR is not formed at the minimum pitch but is designed in accordance with the width of transfer region XR. Such an increase in the area of transfer region XR may lead to an increase in the chip area of the semiconductor memory device and to an increase in the manufacturing cost.

Figure 18:
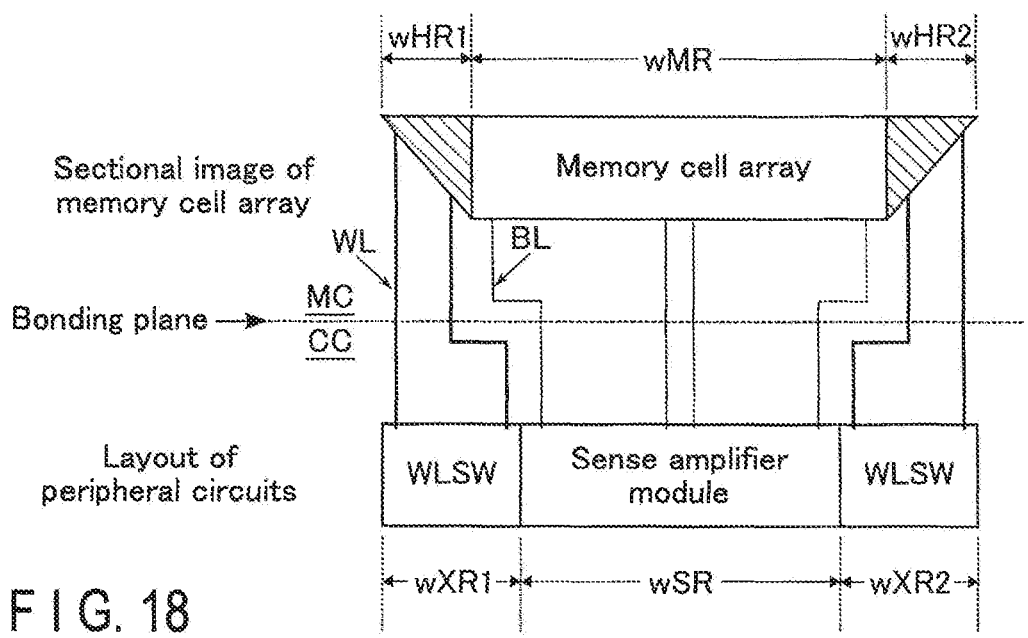
FIG. 18 is a schematic diagram showing an example of a structure of the semiconductor memory device according to the first embodiment.

On the other hand, in the semiconductor memory device 1 according to the first embodiment, part of the transfer region XR is arranged to overlap the memory cell array 10. In other words, the semiconductor memory device 1 according to the first embodiment has a structure in which part of the sense amplifier module 14 and part of the row decoder module 16 are arranged such that they are hidden under the memory cell array 10. FIG. 18 is a schematic diagram similar to FIG. 17 and showing an example of a structure of the semiconductor memory device according to the first embodiment. As shown in FIG. 18, where the width of transfer region XR is the same between the first embodiment and the comparative example of the first embodiment, the width of the sense amplifier region SR is smaller in the first embodiment than in the comparative example of the first embodiment.

In contrast, in the semiconductor memory device 1 according to the first embodiment, the number of sense amplifier units SAU arranged in the extending direction of the bit lines BL is increased, so that that region of the transfer region XR which overlaps the memory region MR is secured under the memory region MR. Furthermore, in the semiconductor memory device 1 according to the first embodiment, part of the bit lines BL in the memory chip MC are coupled to the sense amplifier units SAU in the CMOS chip CC by using wirings that are orthogonal to the bit lines BL. Likewise, part of the stacked wirings (e.g., the word lines WL) in the memory chip MC are coupled to the transfer switches WLSW in the CMOS chip CC by using wirings orthogonal to the bit lines BL.

With this structure, the semiconductor memory device 1 according to the first embodiment can provide a structure in which part of the transfer region XR and the memory region MR overlap each other with no need to add a wiring layer. As a result, in the semiconductor memory device 1 according to the first embodiment, the layout of the hookup region HR and the layout of the transfer region XR can be designed independently, and the staircase structure in the hookup region HR can be formed at the minimum pitch. Accordingly, the semiconductor memory device 1 according to the first embodiment enables reduction of the chip area and suppression of the manufacturing cost of the semiconductor memory device 1.

[2] Second Embodiment

The semiconductor memory device 1 according to the second embodiment has a structure in which hookup region HR is sandwiched by two memory regions MR. The semiconductor memory device 1 according to the second embodiment has a portion where the transfer region XR and the memory regions MR overlap, as in the first embodiment. A description will be given of the points in which the semiconductor memory device 1 according to the second embodiment differs from that according to the first embodiment.

[2-1] Structure of Semiconductor Memory Device 1

Figure 19:
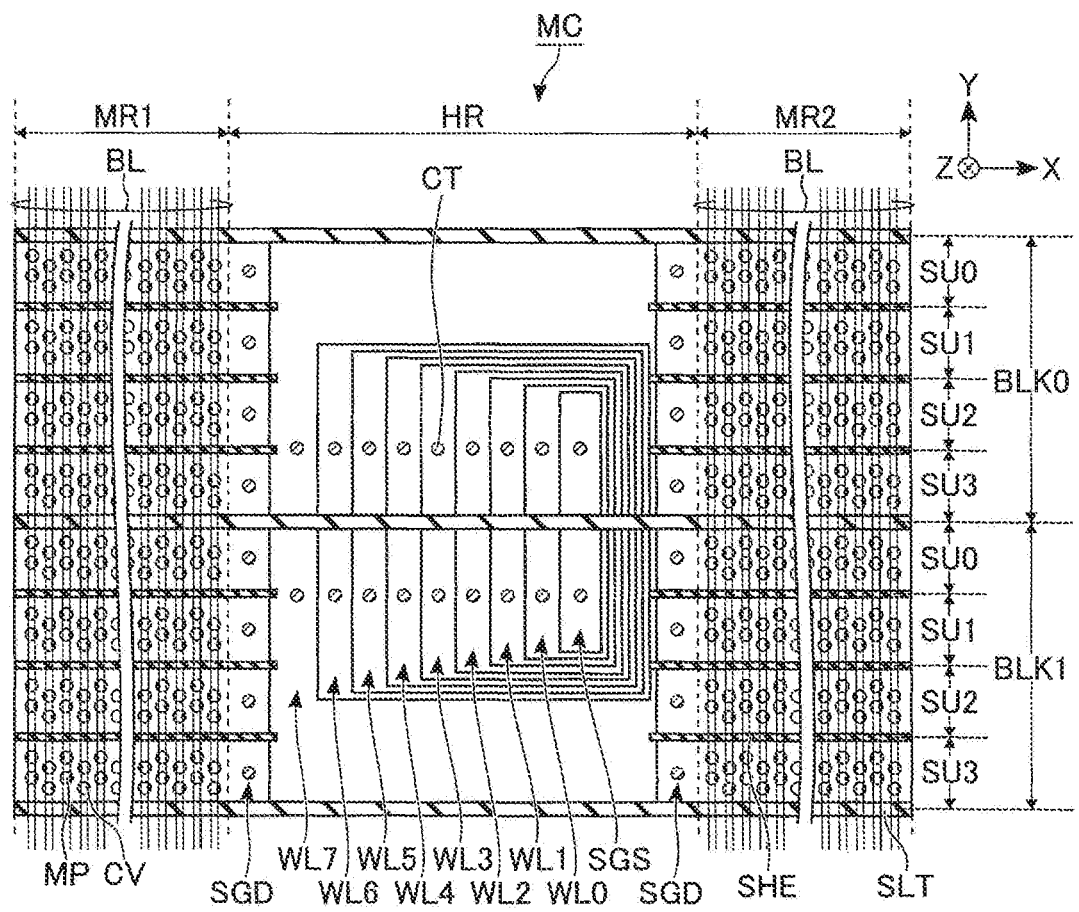
FIG. 19 is a plan view showing an example of a planar layout of a memory chip included in a semiconductor memory device according to a second embodiment.

FIG. 19 shows an example of a planar layout of the memory chip MC of the semiconductor memory device 1 according to the second embodiment, and shows regions corresponding to blocks BLK0 and BLK1. As shown in FIG. 19, in the semiconductor memory device 1 according to the second embodiment, the region of memory chip MC is divided into, for example, two memory regions MR1 and MR2 and one hookup region HR. The memory regions MR1 and MR2 have structures similar to the structure of the memory region MR of the first embodiment, and sandwich hookup region HR.

In the semiconductor memory device 1 according to the second embodiment, slit SHE is provided in place of slit SLT that is sandwiched between slits SLT corresponding to the boundaries of blocks BLK in the first embodiment. Slit SHE is a slit that divides and insulates select gate lines SGD. In the second embodiment, each of the regions that are partitioned by slits SHE between the adjacent slits SLT corresponds to one string unit SU.

In the hookup region HR of the second embodiment, a staircase structure made up of the select gate lines SGS and SGD and the word lines WL0 to WL7 is formed, as in the first embodiment. The staircase structure is formed, for example, in the vicinity of the boundary between two blocks BLK. For example, the terrace portions of the stacked wirings corresponding to the block BLK0 and the terrace portions of the stacked wirings corresponding to the block BLK1 are separated and insulated by slit SLT between the blocks BLK0 and BLK1.

Further, in the hookup region HR of the second embodiment, each of select gate line SGS and word lines WL0 to WL7 has a portion continuously provided between the memory regions MR1 and MR2, in the hookup region HR and in the region where the staircase structure is not provided. That is, between the memory regions MR1 and MR2, the select gate line SGS and the word lines WL0 to WL7 are electrically coupled via the hookup region HR. A plurality of contacts CT are provided for each block BLK such that they are on the terrace portions of the stacked wirings formed in the hookup region HR.

On the other hand, the select gate line SGD in the memory region MR1 and the select gate line SGD in the memory region MR2 are separated in the hookup region HR. Therefore, contacts CT are provided on both the terrace portion of the select gate line SGD in the memory region MR1 and the terrace portion of the select gate line SGD in the memory region MR2. The separate select gate lines SGD may be short-circuited in a region that is not illustrated; alternatively, the sequencer 13 may control the separate select gate lines SGD in synchronism with each other.

Figure 20:
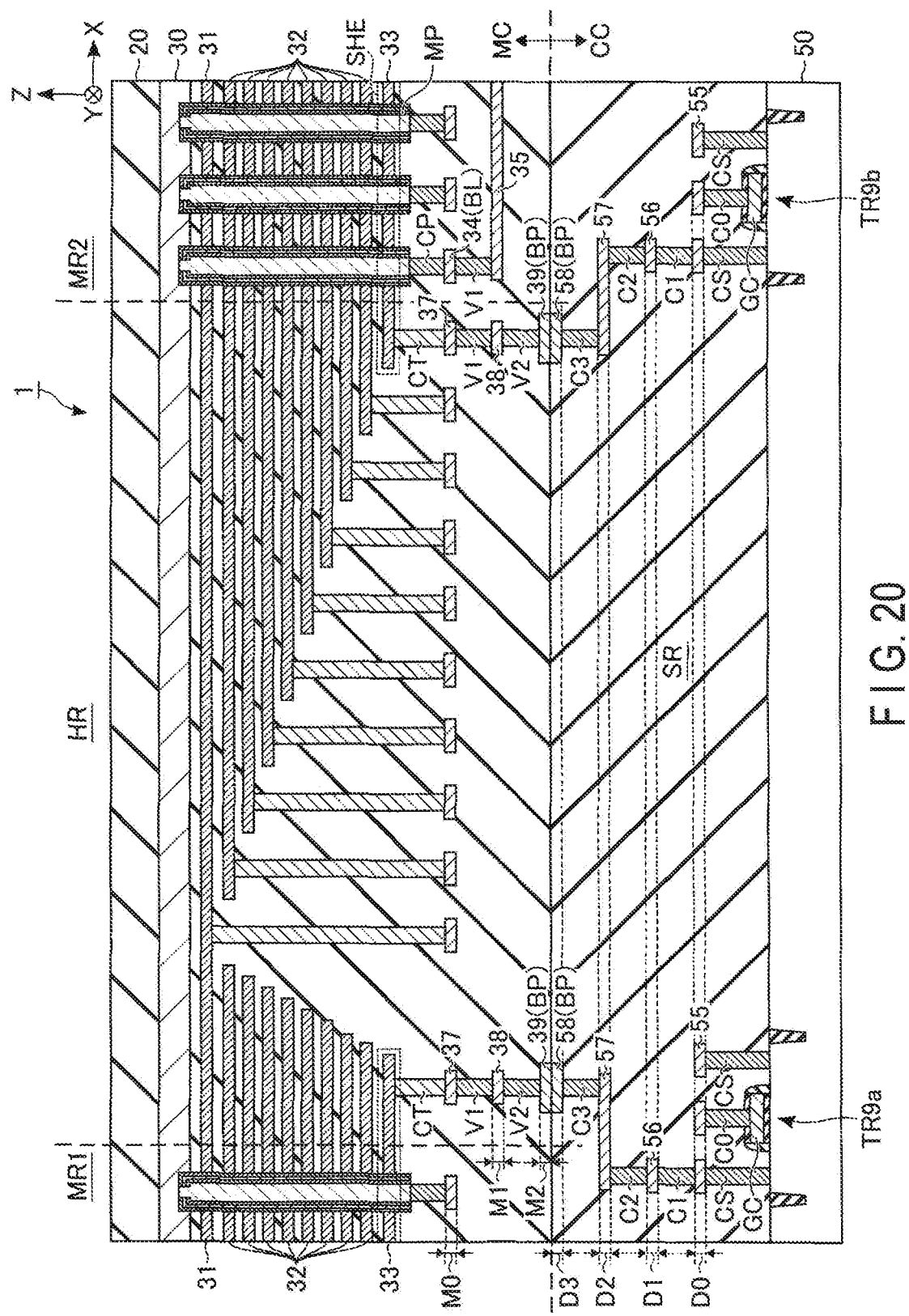
FIG. 20 is a sectional view showing an example of a sectional structure of the semiconductor memory device according to the second embodiment.

FIG. 20 shows an example of a sectional structure of the semiconductor memory device 1 according to the second embodiment, and shows a structure in which a memory chip MC and a CMOS chip CC are bonded to each other. In FIG. 20, a structure corresponding to a conductive layer 33 (select gate line SGD) of the memory region MR1 and a structure corresponding to a conductive layer 33 (select gate line SGD) of the memory region MR2 are extracted and shown. As shown in FIG. 20, the CMOS chip CC includes transistors TR9a and TR9b in the sense amplifier region SR.

The transistor TR9a is a transfer switch WLSW provided in correspondence to a select gate line SGD provided in the memory region MR1. The transistor TR9b is a transfer switch WLSW provided in correspondence to a select gate line SGD provided in the memory region MR2. The pair of transistors TR9a and TR9b corresponds to the transistor TR9 described in connection with the first embodiment. The structure of each of transistors TR9a and TR9b is similar to the structure of the transistor TR7 described in connection with the first embodiment. The structure of the transistor TR that is associated with the select gate line SGS and one of the word lines WL0 to WL7 in the sense amplifier region SR is similar to the structure of the transistor TR7 described in connection with the first embodiment.

The semiconductor memory device 1 according to the second embodiment can include a transistor TR arranged below the memory region MR1 and a transistor TR arranged below the memory region MR2. That is, the plurality of transistors TR in the row decoder RD can include transistors TR arranged below the memory pillars MP and transistors TR arranged below the hookup region HR. For example, a conductive layer 57 coupled to transistor TR arranged below memory region MR1 or MR2 has a portion extending in the X direction in wiring layer D2. A conductive layer 35 coupled to memory pillar MP arranged above transistor TR has a portion extending in the X direction in wiring layer M1.

For example, part of the wirings (e.g., conductive layer 57) for coupling the bonding pads BP in the hookup region HR and the transfer switches WLSW are designed such that they are shorter as they are closer to the intermediate line of the hookup region HR. Although not shown, the wirings for coupling bit lines BL and wirings BLI are designed, for example, such that they are shorter as they are more away from the hookup region HR.

The other structures of the semiconductor memory device 1 according to the second embodiment are similar to those of the first embodiment.

[2-2] Advantages of Second Embodiment

Figure 21:
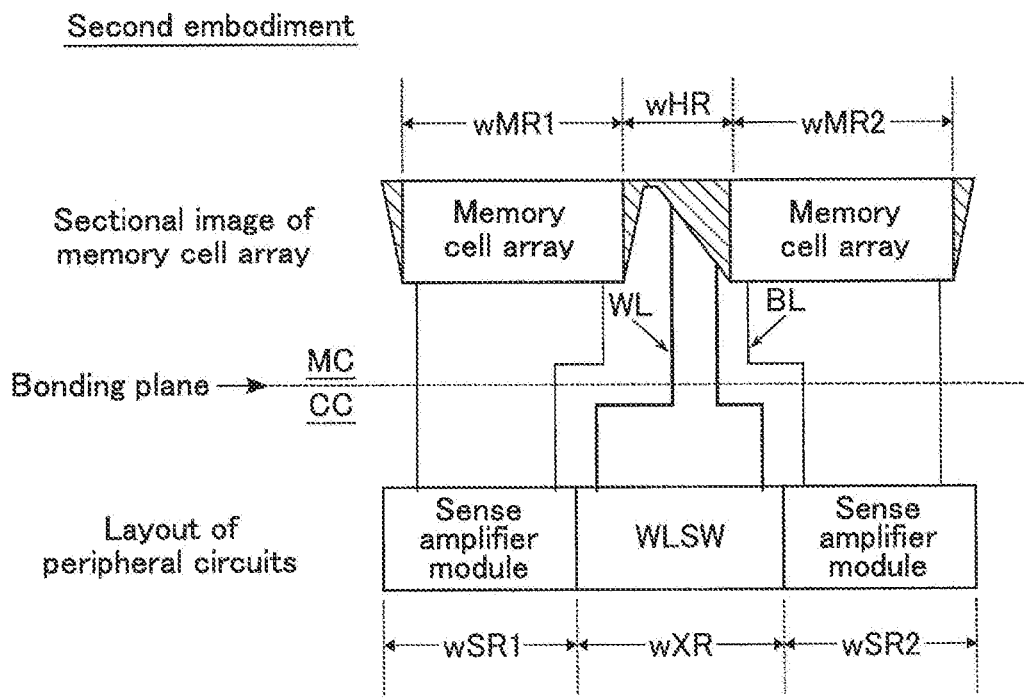
FIG. 21 is a schematic diagram showing an example of a structure of the semiconductor memory device according to the second embodiment.

FIG. 21 is a schematic diagram similar to FIG. 18 and showing an example of a structure of the semiconductor memory device according to the second embodiment. As shown in FIG. 21, the semiconductor memory device according to the second embodiment includes a hookup region HR sandwiched between two memory regions MR1 and MR2, and part of the transfer region XR overlaps the memory regions MR1 and MR2.

With this structure, the semiconductor memory device 1 according to the second embodiment can be provided with a staircase structure that is formed with the minimum pitch in the hookup region HR, as in the first embodiment. As a result, the semiconductor memory device 1 according to the second embodiment enables reduction of the chip area and suppression of the manufacturing cost of the semiconductor memory device 1, as in the first embodiment.

[3] Third Embodiment

The semiconductor memory device 1 according to the third embodiment has a structure in which a memory cell array 10, a sense amplifier module 14, etc. are formed using the same semiconductor substrate. The semiconductor memory device 1 according to the third embodiment has a structure in which the memory cell array 10 and part of the row decoder module 16 are provided to overlap each other, as in the first embodiment. A description will be given of the points in which the semiconductor memory device 1 of the third embodiment differs from those of the first and second embodiments.

[3-1] Structure of Semiconductor Memory Device 1

Figure 22:
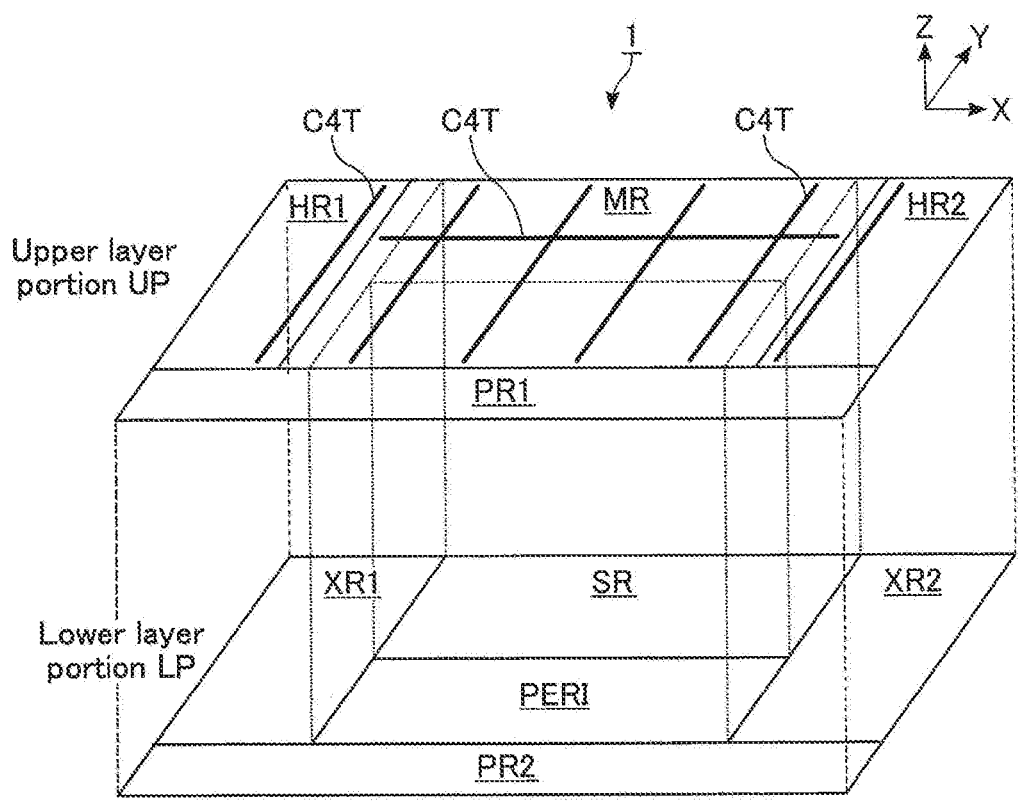
FIG. 22 is a perspective view showing an example of a structure of a semiconductor memory device according to a third embodiment.

FIG. 22 shows an example of an overall structure of the semiconductor memory device 1 according to the third embodiment. As shown in FIG. 22, the semiconductor memory device 1 according to the third embodiment includes an upper layer portion UP and a lower layer portion LP. The upper layer portion UP and the lower layer portion LP are formed using one semiconductor substrate. The functional circuits and regions included in the upper layer portion UP are similar to those of the memory chip MC of the first embodiment, for example. The functional circuits and regions included in the lower layer portion LP are similar to those of the CMOS chip CC of the first embodiment, for example. The upper layer portion UP includes a plurality of contact regions C4T, for example, in the memory region MR and the hookup regions HR1 and HR2.

Each contact region C4T is a region where a contact penetrating the upper layer portion UP is provided. The contact is used for coupling a circuit provided above the memory cell array 10 and a circuit provided below the memory cell array 10. For example, a stacked wiring (e.g., word line WL) provided in the upper layer portion UP is coupled to the row decoder module 16 below the memory cell array 10 via a wiring above the memory cell array 10 and a contact in the contact region C4T. Likewise, a bit line BL provided in the upper layer portion UP is coupled to the sense amplifier module 14 below the memory cell array 10 via a wiring above the memory cell array 10 and a contact in the contact region C4T.

The contact region C4T extending in the X direction is arranged at the boundary between two adjacent blocks BLK. The contact region C4T extending in the X direction may have a structure in which stacked wirings are not provided and an insulator is embedded. In this case, for example, a dummy staircase structure of stacked wirings is formed in a portion that is adjacent to the contact region C4T in the Y direction. The contact region C4T extending in the Y direction may have a structure in which some of the stacked wirings are replaced with insulators.

Figure 23:
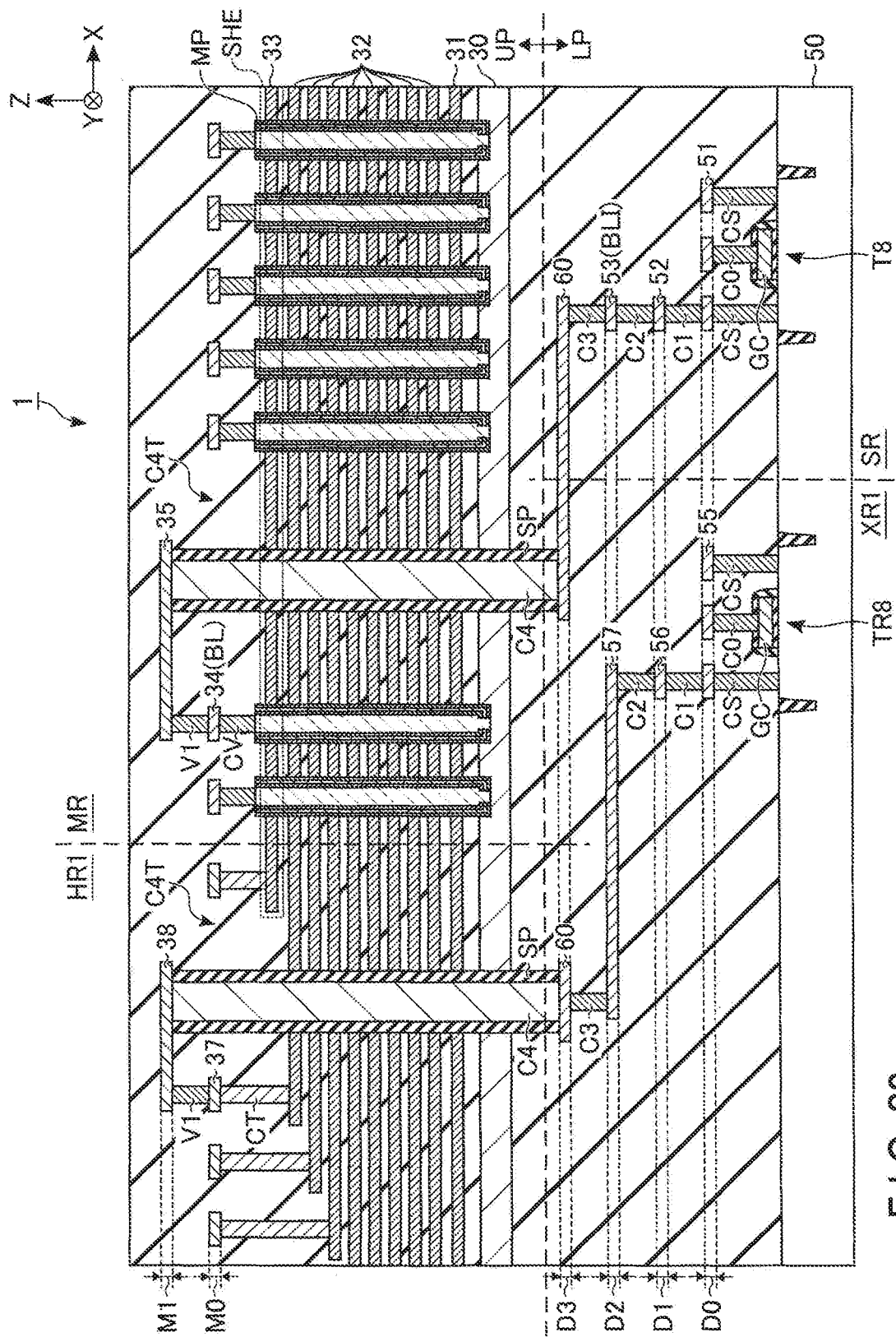
FIG. 23 is a sectional view showing an example of a sectional structure of the semiconductor memory device according to the third embodiment.

FIG. 23 shows an example of a sectional structure of the semiconductor memory device 1 according to the third embodiment, and shows a section including the upper layer portion UP and the lower layer portion LP. In FIG. 23, transistor TR8 corresponding to word line WL7 and transistor T8 corresponding to one bit line BL of the memory region MR are extracted and shown. As shown in FIG. 23, the semiconductor memory device 1 according to the third embodiment is formed, for example, on a semiconductor substrate 50. The structure of the upper layer portion UP is similar to the structure in which the memory chip MC of the first embodiment is vertically inverted.

For example, in the semiconductor memory device 1 according to the first embodiment, the Z-direction interval between the semiconductor substrate 50 and conductive layer 34 (bit line BL) is narrower than the Z-direction interval between the semiconductor substrate 50 and conductive layer 32 (word line WL). On the other hand, in the semiconductor memory device 1 according to the third embodiment, the Z-direction interval between the semiconductor substrate 50 and conductive layer 34 is wider than the Z-direction interval between the semiconductor substrate 50 and conductive layer 32.

The structure of the lower layer portion LP is similar to the structure of the CMOS chip CC of the first embodiment except that each bonding pad BP is replaced with conductive layer 60. Specifically, in the sense amplifier region SR, the conductive layer 60 is provided on the contact C3. The wiring layout of conductive layer 60 in the sense amplifier region SR is similar to that of conductive layer 35 (wiring BLI) described in connection with the first embodiment. A columnar contact C4 is provided on the conductive layer 60. The contact C4 penetrates the conductive layers 30 to 33. The contact C4 and the conductive layers 30 to 33 are separated and insulated by a spacer SP, for example. The upper surface of the contact C4 coupled to transistor T8 is in contact with the conductive layer 35 coupled to the associated bit line BL.

Likewise, in transfer region XR1, the conductive layer 60 is provided on the contact C3. The wiring layout of conductive layer 60 in transfer region XR1 is similar to that of conductive layer 57 described in connection with the first embodiment. A columnar contact C4 is provided on conductive layer 57. The structure of the contact C4 corresponding to transfer region XR1 is similar to the structure of the contact C4 corresponding to the sense amplifier region SR. The upper surface of the contact C4 coupled to transistor TR8 is in contact with the conductive layer 38 coupled to word line WL7.

In the semiconductor memory device 1 according to the third embodiment, the plurality of transistors TR in the row decoder RD can include transistors TR arranged below the memory pillar MP and transistors TR arranged below the hookup region HR. For example, a conductive layer 57 coupled to transistor TR arranged below the memory region MR has a portion extending in the X direction in wiring layer D2. A conductive layer 35 coupled to the memory pillar MP arranged above transistor TR has a portion extending in the X direction in wiring layer M1.

For example, part of the wirings (e.g., conductive layer 57) for coupling the bonding pads BP of hookup region HR and the transfer switches WLSW are designed such that portions extending in the X direction are shorter as the wirings are arranged on the outer side, as in the first embodiment. Furthermore, the lengths of the wirings for coupling bit line BL and wiring BLI are designed such that the portions extending in the X direction are longer as the wirings correspond more to the outermost bit line BL, as in the first embodiment. The other structures of the semiconductor memory device 1 according to the third embodiment are similar to those of the first embodiment.

[3-2] Advantages of Third Embodiment

Where the memory cell array 10 and the peripheral circuit are formed using one semiconductor substrate, the memory cell array 10 and the peripheral circuit are coupled to each other using a wiring provided above the memory cell array 10. The contact C4 for coupling the memory cell array 10 and the row decoder module 16 is arranged, for example, in the contact region C4T provided inside the staircase portion of the stacked wirings or in the outside of the staircase portion.

Figure 24:
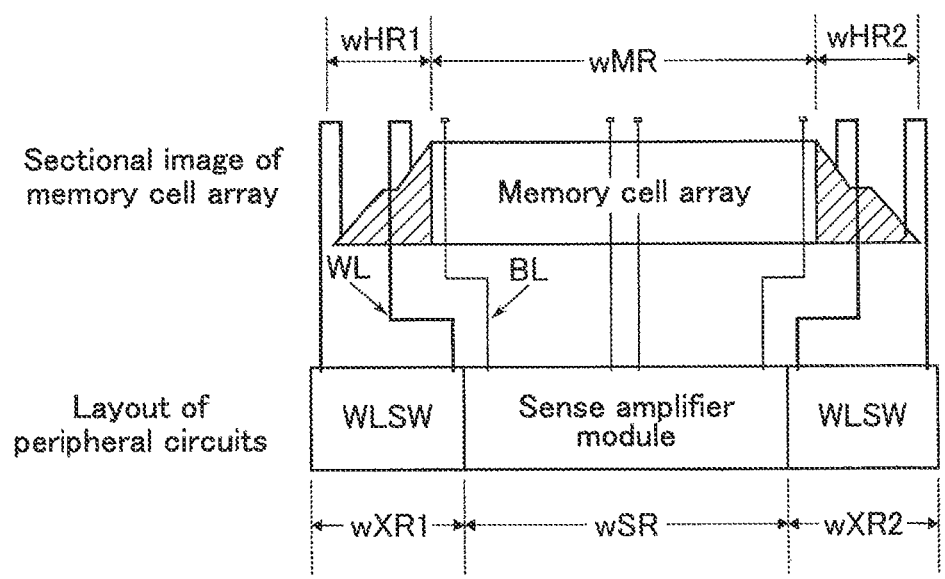
FIG. 24 is a schematic diagram showing an example of a structure of the semiconductor memory device according to the third embodiment.

FIG. 24 is a schematic diagram similar to FIG. 18 and showing an example of a structure of the semiconductor memory device according to the third embodiment. As shown in FIG. 24, the semiconductor memory device according to the third embodiment has a structure in which the memory cell array 10 and a peripheral circuit are coupled via a wiring provided above the memory cell array 10. In the semiconductor memory device 1 according to the third embodiment, part of each of transfer regions XR1 and XR2 overlaps the memory region MR, as in the first embodiment.

Therefore, in the semiconductor memory device 1 according to the third embodiment, the layout of the hookup region HR and the layout of the transfer region XR can be designed independently, and the size of the hookup region HR can be made minimum. As a result, the semiconductor memory device 1 according to the third embodiment enables reduction of the chip area and suppression of the manufacturing cost of the semiconductor memory device 1.

[3-3] Modification of Third Embodiment

Figure 25:
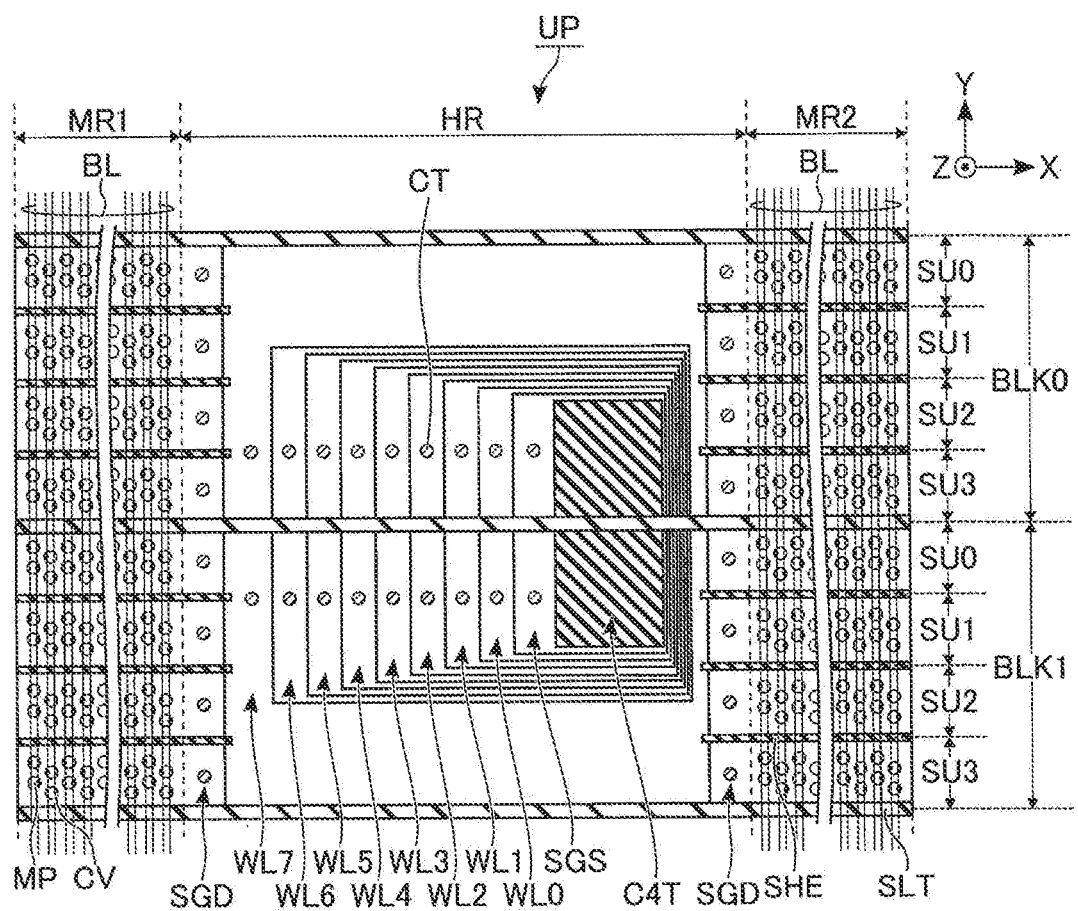
FIG. 25 is a plan view showing an example of a planar layout of a memory chip included in a semiconductor memory device according a modification of the third embodiment.

The structure described in connection with the third embodiment and the structure described in connection with the second embodiment can be combined together. FIG. 25 shows an example of a planar layout of the upper layer portion UP of the semiconductor memory device 1 according to a modification of the third embodiment, and shows regions corresponding to blocks BLK0 and BLK1. As shown in FIG. 25, in the modification of the third embodiment, the upper layer portion UP has a planar layout similar to that of the memory chip MC of the second embodiment, for example, and further includes a contact region C4T.

In the modification of the third embodiment, the contact region C4T is provided near the terrace portion of select gate line SGS. Although not shown, a plurality of contacts C4 are arranged in the contact region C4T. For example, the contact region C4T according to the modification of the third embodiment is formed by removing part of source lines SL when the stacked wirings according to the second embodiment are shaped as a staircase. The other structures of the semiconductor memory device 1 according to the modification of the third embodiment are similar to those of the second embodiment or third embodiment.

The semiconductor memory device 1 according to the modification of the third embodiment enables reduction of the chip area and suppression of the manufacturing cost of the semiconductor memory device 1, as in the first to third embodiments.

[4] Other Modifications

According to the embodiment, a semiconductor device includes a substrate, a first memory cell, a first bit line, a first word line, a first transistor, and a second transistor. The first memory cell is provided above the substrate. The first bit line extends in a first direction. The first bit line is coupled to the first memory cell. The first word line extends in a second direction intersecting the first direction. The first word line is coupled to the first memory cell. The first transistor is provided on the substrate. The first transistor is coupled to the first bit line. The second transistor is provided below the first memory cell and on the substrate. The second transistor is coupled to the first word line. With this structure, the chip area of the semiconductor memory device according to the embodiment can be reduced.

In the above embodiments, memory pillar MP may be made of two or more pillars that are coupled in the Z direction. Furthermore, memory pillar MP may have a structure in which a pillar corresponding to select gate line SGD and a pillar corresponding to word line WL are coupled. Furthermore, each of contacts CV, CP, CS, C0 to C3, V1 and V2 may have a structure in which a plurality of contacts are coupled. In this case, a wiring layer may be inserted between the coupled contacts.

Each of memory pillars MP and contacts CV, CP, CS, C0 to C3, V1 and V2 may have a tapered shape or an inverse tapered shape, or may have a shape in which the intermediate portion is swelled. Likewise, slit SLT may have a tapered shape or an inverse tapered shape, or may have a shape in which the intermediate portion is swelled. Although reference was made to the case where the sectional structure of memory pillar MP is circular, the sectional structure of the memory pillar MP may be elliptical or may be designed to have any shape.

In connection with the above-described embodiments, reference was made to the case where the stacked wirings such as the word lines WL form a staircase structure that has steps in the Y direction in the hookup region HR, but this is not restrictive. For example, steps may be formed in the X direction with end portions of the stacked word lines WL and select gate lines SGD and SGS. In the hookup region HR, the end portions of the stacked word lines WL and select gate lines SGD and SGS can be designed to be a staircase with an arbitrary number of columns. The staircase structure formed with select gate line SGS, that formed with each word line WL, and that formed with select gate line SGD may be different from one another.

Although the semiconductor memory device 1 is a NAND flash memory in the above embodiments, the structure of the semiconductor memory device 1 in the above embodiments may be applied to other types of memory devices. For example, the semiconductor memory device 1 may be a resistance change memory that uses a resistance change element as a memory cell. As long as a memory device includes at least a circuit that drives wirings in the vertical direction (e.g., the Y direction) and a circuit that drives wirings in the horizontal direction (e.g., the X direction), a structure similar to that of the semiconductor memory device 1 of the above-described embodiments can be applied, and similar advantages can be obtained.

In the present specification, the term "coupling" means that elements are electrically coupled, and does not exclude the case where another element is interposed in between. Being "electrically coupled" may use an insulator as long as the insulator does not affect the proper operation accomplished by the electrical coupling. The "columnar" indicates that the structure is provided in a hole formed in the manufacturing process of the semiconductor memory device 1. In the present specification, the "minimum pitch" corresponds to the minimum size that can be actually processed in the manufacturing process of a semiconductor memory device, and can be decreased further with the ongoing progress in manufacturing apparatuses and manufacturing methods.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a first memory cell provided above the substrate;
a first bit line extending in a first direction, the first bit line being coupled to the first memory cell;
a first word line extending in a second direction intersecting the first direction, the first word line being coupled to the first memory cell;
a first transistor provided on the substrate, the first transistor being coupled to the first bit line; and
a second transistor provided below the first memory cell and on the substrate, the second transistor being coupled to the first word line.

2. The device of claim 1, further comprising:
a second memory cell coupled to the first word line;
a second bit line extending in the first direction, the second bit line being coupled to the second memory cell;
a third transistor provided on the substrate, a distance between the third transistor and the second transistor being longer than a distance between the first transistor and the second transistor, and the third transistor being coupled to the second bit line;
a first wiring including a portion extending in the second direction, the first wiring being coupled between the first transistor and the first bit line; and
a second wiring including a portion extending in the second direction, the second wiring being coupled between the third transistor and the second bit line,
wherein a portion of the first wiring which extends in the second direction is longer than a portion of the second wiring which extends in the second direction.

3. The device of claim 2, further comprising:
a third memory cell coupled to the first bit line;
a second word line extending in the second direction, the second word line being coupled to the third memory cell;
a fourth transistor provided on the substrate, a distance between the fourth transistor and the first transistor being longer than a distance between the second transistor and the first transistor, and the fourth transistor being coupled to the second word line;
a third wiring including a portion extending in the second direction, the third wiring being coupled between the second transistor and the first word line; and
a fourth wiring including a portion extending in the second direction, the fourth wiring being coupled between the fourth transistor and the second word line,
wherein a portion of the third wiring which extends in the second direction is longer than a portion of the fourth wiring which extends in the second direction.

4. The device of claim 3, further comprising:
a memory cell array region including the first memory cell, the second memory cell, and the third memory cell,
wherein:
the second transistor overlaps the memory cell array region, and
the fourth transistor does not overlap the memory cell array region.

5. The device of claim 3, further comprising:
a first chip including the substrate, the first transistor, the second transistor, the third transistor, and the fourth transistor; and
a second chip including the first memory cell, the second memory cell, the third memory cell, the first word line, the second word line, the first bit line, the second bit line, the first wiring, and the second wiring,
wherein:
the second chip is bonded to the first chip, and
the first wiring and the second wiring are equal in height.

6. The device of claim 3, further comprising:
a first chip including the substrate, the first transistor, the second transistor, the third transistor, the fourth transistor, the third wiring, and the fourth wiring; and
a second chip including the first memory cell, the second memory cell, the third memory cell, the first word line, the second word line, the first bit line, the second bit line, the first wiring, and the second wiring,
wherein:
the second chip is bonded to the first chip, and
the first wiring and the second wiring are equal in height.

7. The device of claim 3, further comprising:
a first chip including the substrate, the first transistor, the second transistor, the third transistor, the fourth transistor, and the fourth wiring; and
a second chip including the first memory cell, the second memory cell, the third memory cell, the first word line, the second word line, the first bit line, the second bit line, the first wiring, the second wiring, and the third wiring,
wherein:
the second chip is bonded to the first chip, and
the first wiring, the second wiring, and the third wiring are equal in height.

8. The device of claim 1, further comprising:
a sense amplifier including the first transistor,
wherein the first transistor is an n-type high-breakdown-voltage transistor.

9. The device of claim 1, further comprising:
a row decoder including the second transistor,
wherein the second transistor is an n-type high-breakdown-voltage transistor.

10. The device of claim 1, further comprising:
a plurality of conductive layers provided apart from each other in a third direction intersecting both the first direction and the second direction, each of the plurality of conductive layers being used as a word line; and
a pillar provided to penetrate the plurality of conductive layers, the pillar including a portion functioning as the first memory cell.

11. The device of claim 1, further comprising:
a plurality of sense amplifier groups aligned in the second direction, each of the plurality of sense amplifier groups including a plurality of sense amplifiers aligned in the first direction; and
a plurality of bit lines aligned in the second direction, the plurality of bit lines including the first bit line, and the plurality of bit lines being coupled to the plurality of sense amplifiers, respectively,
wherein, as viewed in the second direction, a length of a region in which one sense amplifier group are provided is less than a length of a region in which bit lines coupled to the one sense amplifier group are provided.

12. The device of claim 1, further comprising:
a memory cell array region including the first memory cell; and
a sense amplifier region including the first transistor, wherein a width of the sense amplifier region as viewed in the second direction is narrower than a width of the memory cell array as viewed in the second direction.

13. The device of claim 3, further comprising:
a memory cell array region including the first memory cell, the second memory cell, and the third memory cell;
a first region and a second region that sandwich the memory cell array region such that the memory cell array region is provided between the first region and the second region along the second direction;
a first contact that is in contact with the first word line in the first region; and
a second contact that is in contact with the second word line in the first region,
wherein:
the first word line and the second transistor are coupled via the first contact, and
the second word line and the fourth transistor are coupled via the second contact.

14. The device of claim 13, further comprising:
a plurality of word lines provided apart from each other in a third direction, the third direction being a direction perpendicular to a plane extending in both the first direction and the second direction, and the plurality of word lines including the first word line and the second word line; and
a row decoder region that overlaps part of the first region and part of the memory cell array region, the row decoder region including a plurality of high-breakdown-voltage transistors, the plurality of high breakdown voltage transistors being coupled to the plurality of word lines, respectively, and the plurality of high-breakdown-voltage transistors including the second transistor and the fourth transistor,
wherein the plurality of word lines and the plurality of high-breakdown-voltage transistors are coupled via first wirings in a first layer, respectively, the first wirings comprising respective portions extending in the second direction that have a shorter length as a distance to the memory cell array region in the second direction increases.

15. The device of claim 13, further comprising:
a plurality of bit lines each extending in the first direction, the plurality of bit lines including the first bit line and the second bit line; and
a sense amplifier region that overlaps the memory cell array region, the sense amplifier region including a plurality of sense amplifiers, the plurality of sense amplifiers being coupled to the plurality of bit lines, respectively, and the plurality of sense amplifiers including the first transistor and the third transistor,
wherein the plurality of bit lines and the plurality of sense amplifiers are coupled via second wirings in a second layer, respectively, the second wirings comprising respective portions extending in the second direction that have a shorter length as a distance to an intermediate portion of the sense amplifier region in the second direction decreases.

16. The device of claim 13, wherein:
an interval between the substrate and the first bit line as viewed in a third direction is narrower than an interval between the substrate and the first word line as viewed in the third direction, the third direction being a direction perpendicular to a plane extending in both the first direction and the second direction, and the first contact is in contact with the first word line from a substrate side.

17. The device of claim 13, wherein:
an interval between the substrate and the first bit line as viewed in a third direction is wider than an interval between the substrate and the first word line as viewed in the third direction, the third direction being a direction perpendicular to a plane extending in both the first direction and the second direction, and
the first contact is in contact with the first word line via a region which is farther from the substrate than the first word line is.

18. The device of claim 3, further comprising:
a first memory cell array region including the first memory cell and the third memory cell;
a second memory cell array region including the second memory cell;
a third region between the first memory cell array region and the second memory cell array region;
a first contact that is in contact with the first word line in the third region; and
a second contact that is in contact with the second word line in the third region,
wherein:
the first word line and the second transistor are coupled via the first contact, and
the second word line and the fourth transistor are coupled via the second contact.

19. The device of claim 18, further comprising:
a plurality of word lines provided apart from each other in a third direction intersecting both the first direction and the second direction, the plurality of word lines including the first word line and the second word line; and
a row decoder region that overlaps part of the third region and part of the first memory cell array region, the row decoder region including a plurality of high-breakdown-voltage transistors, the plurality of high-breakdown-voltage transistors being coupled to the plurality of word lines, respectively, and the plurality of high-breakdown-voltage transistors including the second transistor and the fourth transistor,
wherein the plurality of word lines and the plurality of high-breakdown-voltage transistors are coupled via first wirings in a first layer, respectively, the first wirings comprising respective portions extending in the second direction that have a shorter length as a distance to the row decoder region in the second direction decreases.

20. The device of claim 18, further comprising:
a plurality of bit lines each extending in the first direction in both the first memory cell array region and the second memory cell array region, the plurality of bit lines including the first bit line in the first memory cell array region, and the plurality of bit lines including the second bit line in the second memory cell array region; and
a first sense amplifier region and a second sense amplifier region respectively overlapping the first memory cell array region and the second memory cell array region, the first sense amplifier region and the second sense amplifier region each including a plurality of sense amplifiers, the plurality of sense amplifiers being respectively coupled to the plurality of bit lines, the plurality of sense amplifiers including the first transistor in the first sense amplifier region, and the plurality of sense amplifiers including the third transistor in the second sense amplifier region, wherein the plurality of bit lines and the plurality of sense amplifiers are coupled via second wirings in a second layer, respectively, the second wirings comprising respective portions extending in the second direction that have a shorter length as a distance to an intermediate portion of the sense amplifier region in the second direction decreases.

\* \* \* \* \*